(12) United States Patent
Tsuzuki et al.

(10) Patent No.: US 8,288,824 B2
(45) Date of Patent: Oct. 16, 2012

(54) SEMICONDUCTOR DEVICE INCLUDING INSULATED GATE BIPOLAR TRANSISTOR AND DIODE

(75) Inventors: Yukio Tsuzuki, Nukata-gun (JP); Hiromitsu Tanabe, Nukata-gun (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/282,670

(22) Filed: Oct. 27, 2011

(65) Prior Publication Data

US 2012/0056242 A1    Mar. 8, 2012

Related U.S. Application Data

(62) Division of application No. 12/654,228, filed on Dec. 15, 2009, now Pat. No. 8,080,853.

(30) Foreign Application Priority Data

Dec. 24, 2008  (JP) .................................. 2008-328426
Nov. 12, 2009  (JP) .................................. 2009-259135

(51) Int. Cl.
*H01L 29/739* (2006.01)

(52) U.S. Cl. ........ 257/368; 257/262; 257/371; 257/577; 257/565; 257/E27.022; 257/E27.037; 257/E27.019; 438/328

(58) Field of Classification Search .................. 257/577, 257/E27.022, E27.037, 565, E27.019, 262, 257/368, 371; 438/328
See application file for complete search history.

(56) References Cited

U.S. PATENT DOCUMENTS

| | | | | |
|---|---|---|---|---|
| 5,178,370 A | * | 1/1993 | Clark et al. | 257/212 |
| 5,360,984 A | | 11/1994 | Kirihata | |
| 5,903,034 A | * | 5/1999 | Sakamoto et al. | 257/379 |
| 6,051,850 A | | 4/2000 | Park | |
| 6,180,966 B1 | * | 1/2001 | Kohno et al. | 257/173 |
| 6,222,248 B1 | * | 4/2001 | Fragapane | 257/565 |
| 6,404,037 B1 | | 6/2002 | Finney | |

(Continued)

FOREIGN PATENT DOCUMENTS

JP    A-2005-183547    7/2005

(Continued)

OTHER PUBLICATIONS

Office Action mailed Dec. 6, 2011 in corresponding JP Application No. 2009-259135 (and English translation).

(Continued)

*Primary Examiner* — Marcos D. Pizarro
*Assistant Examiner* — Bilkis Jahan
(74) *Attorney, Agent, or Firm* — Posz Law Group, PLC

(57) ABSTRACT

A semiconductor device includes a vertical IGBT and a vertical free-wheeling diode in a semiconductor substrate. A plurality of base regions is disposed at a first-surface side portion of the semiconductor substrate, and a plurality of collector regions and a plurality of cathode regions are alternately disposed in a second-surface side portion of the semiconductor substrate. The base regions include a plurality of regions where channels are provided when the vertical IGBT is in an operating state. The first-side portion of the semiconductor substrate include a plurality of IGBT regions each located between adjacent two of the channels, including one of the base regions electrically coupled with an emitter electrode, and being opposed to one of the cathode regions. The IGBT regions include a plurality of narrow regions and a plurality of wide regions.

7 Claims, 11 Drawing Sheets

U.S. PATENT DOCUMENTS

| | | | |
|---|---|---|---|
| 7,408,228 B2 * | 8/2008 | Hatade et al. | 257/369 |
| 7,432,135 B2 | 10/2008 | Takahashi | |
| 7,456,484 B2 | 11/2008 | Ozeki et al. | |
| 7,518,197 B2 * | 4/2009 | Yamaguchi | 257/401 |
| 7,692,214 B2 | 4/2010 | Tokura et al. | |
| 7,692,240 B2 * | 4/2010 | Ishida et al. | 257/339 |
| 7,812,402 B2 * | 10/2010 | Hatade | 257/372 |
| 7,851,866 B2 * | 12/2010 | Sakurai et al. | 257/368 |
| 2005/0017290 A1 | 1/2005 | Takahashi et al. | |
| 2006/0065923 A1 | 3/2006 | Pfirsch | |
| 2007/0080407 A1 | 4/2007 | Kono | |
| 2007/0215938 A1 | 9/2007 | Yanagida et al. | |
| 2008/0048295 A1 | 2/2008 | Takahashi | |
| 2009/0001411 A1 | 1/2009 | Tokura et al. | |
| 2009/0057832 A1 | 3/2009 | Kouno | |
| 2009/0173995 A1 | 7/2009 | Takahashi | |
| 2010/0308370 A1 | 12/2010 | Hshieh | |

FOREIGN PATENT DOCUMENTS

| | | |
|---|---|---|
| JP | A-2008-72848 | 3/2008 |
| JP | A-2008-283112 | 11/2008 |
| JP | A-2008-300529 | 12/2008 |

OTHER PUBLICATIONS

Office Action mailed Jan. 18, 2011 issued from the Japanese Patent Office for the corresponding Japanese patent application No. 2009-259135 (English translation enclosed).

* cited by examiner

SEMICONDUCTOR DEVICE INCLUDING INSULATED GATE BIPOLAR TRANSISTOR AND DIODE

CROSS REFERENCE TO RELATED APPLICATIONS

This application is a divisional of U.S. application Ser. No. 12/654,228 filed on Dec. 15, 2009, allowed on Aug. 31, 2011, which is based on and claims priority to Japanese Patent Applications No. 2008-328426 filed on Dec. 24, 2008, and No. 2009-259135 filed on Nov. 12, 2009, the contents of which are incorporated in their entirety herein by reference.

BACKGROUND OF THE INVENTION

1. Field of the Invention

The present invention relates to a semiconductor device including a vertical insulated gate bipolar transistor (vertical IGBT) and a vertical free-wheeling diode (vertical FWD) formed in one semiconductor substrate.

2. Description of the Related Art

In a conventional reverse-conducting IGBT device (RC-IGBT device), a vertical FWD and a vertical IGBT are formed in one semiconductor substrate as described, for example, in US 2005/0017290 A (corresponding to JP-A-2005-57235) and US 2008/0048295 A (corresponding to JP-A-2008-53648).

In the RC-IGBT device, an anode electrode of the FWD and an emitter electrode of the IGBT are provided by a common electrode, and a cathode electrode of the FWD and a collector electrode of the IGBT are provided by a common electrode. The RC-IGBT device is included, for example, in an inverter circuit for a pulse width modulation control (PWM control) of a load.

When the RC-IGBT device is included in the inverter circuit, a drive signal to be input to a gate electrode of the IGBT is a signal generally phase-inverted to upper and lower arms. Thus, in a case of inductive load, that is, in a case where a load includes an inductance component, the driving signal is input to the gate electrode of the IGBT even when the FWD is free wheeling. That is, the FWD and the IGBT formed in the one semiconductor substrate are concurrently operated. In order to completely activate the IGBT, the gate electrode of the IGBT is applied with a voltage that is two to three times greater than a threshold voltage and is less than or equal to a rated gate-emitter voltage. For example, the gate electrode is applied with a voltage of 15 V. Thus, in the RC-IGBT device included in the inverter circuit, the FWD is required to be operated in a state where a gate voltage of 15 V is applied, that is, in a state where the IGBT is in operation.

In addition, in the RC-IGBT device, as described in US 2005/0017290 A (for example, FIG. 28) and US 2008/0048295 A (for example, FIG. 16), regions of the IGBT (IGBT regions) and regions of the FWD (FWD region) are alternately arranged in a direction perpendicular to a thickness direction of the semiconductor substrate so that the IGBT and the FWD are operated uniformly and an electric-current concentration can be restricted. When a width of the FWD regions in the one direction is reduced, an electric current distribution during a forward operation is more uniformed and a performance of the FWD can be improved.

The inventors of the present application examined the above-described composition, in which the IGBT regions and the FWD regions are alternately arranged, using a device simulation. As a result of the examination, the inventors found that, when the gate voltage is 15 V, a forward-direction operation of the FWD may be difficult depending on the width of the FWD regions, and a forward voltage Vf may locally increase, that is, a snapback may generate, at a small electric-current region of a forward current "If." The snapback is remarkable at a low temperature side. When a spike-shaped snapback generates in the forward voltage Vf, the inverter circuit may malfunction. In addition, the forward voltage Vf may increase by the snapback, and a direct-current loss may increase.

SUMMARY OF THE INVENTION

In view of the foregoing problems, it is an object of the present invention to provide a semiconductor device in which an IGBT and an FWD are formed in one semiconductor substrate, the FWD can uniformly operate, and a snapback of the FWD can be reduced.

According to an aspect of the present invention, a semiconductor device includes a vertical IGBT and a vertical FWD in a semiconductor substrate of a first conductivity type. The semiconductor substrate has a first surface and a second surface opposing each other. The vertical IGBT and the vertical FWD are coupled in anti-parallel with each other. The vertical IGBT includes a gate electrode adjacent to the first surface of the semiconductor substrate. The semiconductor substrate has a first-surface side portion adjacent to the first surface and a second-surface side portion adjacent to the second surface. The semiconductor device includes a plurality of base regions of a second conductivity type, a plurality of first regions of the first conductivity type, an electrode, a plurality of second regions of the second conductivity type, and a plurality of third regions of the first conductivity type.

The base regions are disposed at the first-surface side portion of the semiconductor substrate and are arranged along one direction perpendicular to a thickness direction of the semiconductor substrate. Each of the base regions includes a first-surface side portion adjacent to the first surface of the semiconductor substrate. The first regions are disposed at the first-surface side portion of a part of the base regions. The first regions have an impurity concentration higher than an impurity concentration of the semiconductor substrate. The first regions constitute a part of the vertical IGBT. The electrode is electrically coupled with a part of the base regions and the first regions. The second regions and the third regions are disposed at the second-surface side portion of the semiconductor substrate. Ones of the second regions and ones of the third regions are alternately arranged in the one direction so as to be adjacent to each other. The second regions constitute a part of the vertical IGBT. The third regions constitute a part of the vertical FWD. The third regions have an impurity concentration higher than the impurity concentration of the semiconductor substrate.

When the vertical IGBT is in an operating state, a plurality of channels of the first conductivity type is provided in the part of the base regions including the first regions in such a manner that ones of the channels is respectively adjacent to ones of the first regions. The first-surface side portion of the semiconductor substrate includes a plurality of fourth regions arranged in the one direction. Ones of the fourth regions are respectively opposed to ones of the third regions. Each of the fourth regions is located between adjacent two of the channels and includes one region of the base regions electrically coupled with the electrode. The fourth regions include a plurality of narrow regions and a plurality of wide regions. Each of the narrow regions has a first width in the one direction. Each of the wide regions has a second width in the one direction. The second width is greater than the first width. The number of the narrow regions is greater than the number of the wide regions.

In the semiconductor device according to the first aspect of the present invention, the FWD can uniformly operate and a snapback of the FWD can be reduced.

According to a second aspect of the present invention 10, a semiconductor device includes a vertical IGBT and a vertical FWD in a semiconductor substrate of a first conductivity type. The semiconductor substrate has a first surface and a second surface opposing each other. The vertical IGBT and the vertical FWD are coupled in anti-parallel with each other. The vertical IGBT includes a gate electrode adjacent to the first surface of the semiconductor substrate. The semiconductor substrate includes a first-surface side portion adjacent to the first surface and a second-surface side portion adjacent to the second surface. The semiconductor substrate has a main section where the vertical IGBT is disposed and an outer peripheral section having a ring shape and surrounding the main section in one direction perpendicular to a thickness direction of the semiconductor substrate. The semiconductor device includes a plurality of base regions of a second conductivity type, a plurality of first regions of the first conductivity type, an electrode, a plurality of second regions of the second conductivity type, and a plurality of third regions of the first conductivity type.

The base regions are disposed at the first-surface side portion of the semiconductor substrate and are arranged along the one direction. The base regions are located across the main section, and an outer peripheral end of the base regions is located at the outer peripheral section. Each of the base regions includes a first-surface side portion adjacent to the first surface of the semiconductor substrate. The first regions are disposed at the first-surface side portion of a part of the plurality of base regions. The first regions have an impurity concentration higher than an impurity concentration of the semiconductor substrate. The first regions constitute a part of the vertical IGBT. The electrode is electrically coupled with a part of the base regions the first regions. The second regions and the third regions are disposed at the second-surface side portion of the semiconductor substrate. Ones of the second regions and ones of the third regions are alternately arranged in the one direction so as to be adjacent to each other. The second regions constitute a part of the vertical IGBT. The third regions constitute a part of the vertical FWD. The third regions have an impurity concentration higher than the impurity concentration of the semiconductor substrate.

When the vertical IGBT is in an operating state, a plurality of channels of the first conductivity type is provided in the part of the base regions including the plurality of first regions in such a manner that ones the channels is respectively adjacent to ones of the first regions. The base regions include an eighth region at the outer peripheral section. The eighth region is a region from the outer peripheral end of the base regions to a predetermined distance from the outer peripheral end and is located within a region between the outer peripheral end and one of the channels closest to the outer peripheral end in the one direction or a direction perpendicular to the one direction and the thickness direction of the semiconductor substrate. One of the third regions is located at the outer peripheral section and is opposed to the eighth region. The first-surface side portion of the semiconductor substrate further includes a plurality of fourth regions and a ninth region. Ones of the fourth regions are respectively opposed to ones of the third regions. Each of the fourth regions is located between adjacent two of the channels and includes one region of the base regions electrically coupled with the electrode. The ninth region is the region between the outer peripheral end of the base region and the one of the channels closest to the outer peripheral end. Each of the fourth regions has a first width in the one direction. The ninth region has a second width between the outer peripheral end and the one of the channels closest to the outer peripheral end. The second width is greater than a half of the first width.

In the semiconductor device according to the second aspect of the present invention, the FWD can uniformly operate and a snapback of the FWD can be reduced.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

Figure 1:
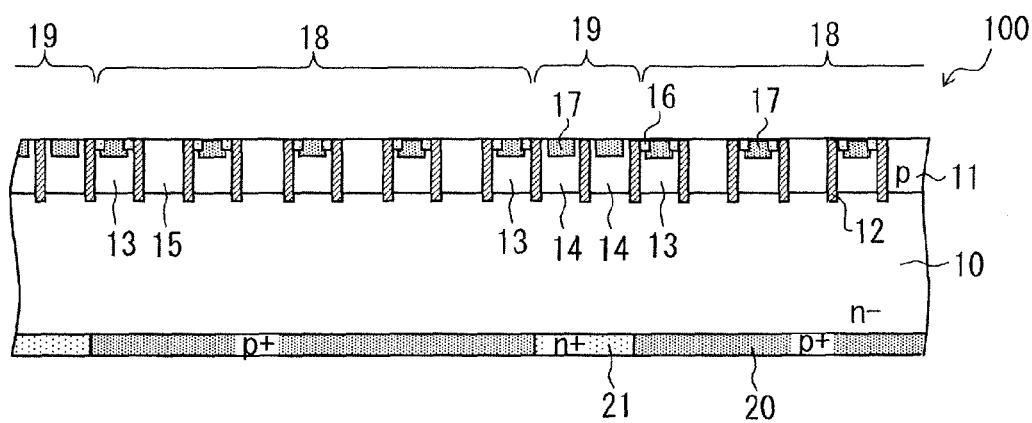
FIG. 1 is a cross-sectional view of a semiconductor device used for a device simulation.

A process that the inventors of the present application create the present invention will be described before describing exemplary embodiments of the present invention.

A composition of a semiconductor device 100 used for a device simulation will be described with reference to FIG. 1. The semiconductor device 100 includes a semiconductor substrate 10. The semiconductor substrate 10 has a thickness of 135 μm, for example. The semiconductor substrate 10 is an N type single-crystalline bulk silicon substrate having an impurity concentration of $1\times10^{14}$ cm$^{-3}$, for example. The semiconductor substrate 10 has first and second surfaces opposing each other. At a first-surface side portion of the semiconductor substrate 10, P type base regions 11 are disposed. The base regions 11 have a depth of 4 μm and have an impurity concentration of $2\times10^{17}$ cm$^{-3}$, for example. A plurality of trenches penetrates the base regions 11 into the semiconductor substrate 10. On an inner wall of the trenches, an insulating layer (not shown) is disposed. The trenches are filled with a conductive material through the insulating layer. The conductive material includes, for example, polysilicon having an impurity concentration of $1\times10^{20}$ cm$^{-3}$, for example. The trenches filled with the conductive material configurate gate electrodes 12. The gate electrodes 12 are arranged at predetermined intervals in a first direction perpendicular to a thickness direction of the semiconductor substrate 10 (hereafter, thickness direction). Each of the gate electrodes 12 extends in a second direction perpendicular to the thickness direction and the first direction. That is, the base regions 11 are separated from each other by the gate electrodes 12 arranged in a stripe manner. The base regions 11 include base regions 13-15. The base regions 13-15 are arranged in the first direction and are insulated from each other.

At a first-surface side portion of each of the base regions 13, N type emitter regions 16 and a P type base contact region 17 are disposed. Each of the emitter regions 16 can operate as a first region and has an impurity concentration greater than the semiconductor substrate 10. Each of the emitter regions 16 is adjacent to a sidewall of one of the gate electrodes 12, that is, the insulating layer in one of the trenches. The emitter regions 16 have a depth of 0.5 μm and has an impurity concentration of $1\times10^{20}$ cm$^{-3}$, for example. The base contact region 17 has a depth of 1.0 μm and has an impurity concentration of $3\times10^{19}$ cm$^{-3}$, for example.

At a first-surface side portion of each of the base regions 14, the emitter regions 16 are not disposed and the base contact region 17 is disposed. At a first-surface side portion of each of the base regions 15, a high impurity concentration region such as the emitter regions 16 and the base contact region 17 is not disposed. Each of the base regions 15 is in a floating region and is not electrically coupled with the gate electrodes 12 and an emitter electrode (not shown).

The emitter regions 16 and the base contact regions 17 are electrically coupled with the emitter electrode that can also operate as an anode electrode. The base regions 13 provide channels and constitute a part of the IGBT. The base regions 14 provide an anode and constitute a part of a FWD.

At a first-surface side portion of the semiconductor substrate 10, IGBT regions 18 and FWD regions 19 are alternately arranged in the first direction, as illustrated in FIG. 1. In each of the IGBT regions 18, the base regions 13 and the base regions 15 are alternately arranged in the first direction, and the base regions 13 are disposed at both ends of the IGBT region 18. The IGBT regions 18 constitute a part of the IGBT. Each of the IGBT regions 18 can operate as a cell region of the IGBT. Each of the FWD regions 19 includes the base regions 14. The FWD regions 19 constitute a part of the FWD. Each of the FWD regions 19 can operate as a fourth region. In the above-described composition, each of the base regions 13 can operate as a fifth region, each of the base regions 14 can operate as a sixth region, and each of the base regions 15 can operate as a seventh region.

At a second-surface side portion of the semiconductor substrate 10, P type collector regions 20 and N type cathode regions 21 are alternately arranged in the first direction. Each of the collector regions 20 can operate as a second region, and each of the cathode regions 21 can operate as a third region. Each of the collector regions 20 is opposite to a corresponding one of the IGBT regions 18 including the base regions 13 and the base regions 15. Each of the cathode regions 21 is opposite to a corresponding one of the FWD regions 19 including the base regions 14. The collector regions 20 and the cathode regions 21 are electrically coupled with a collector electrode (not shown) that can also operate as a cathode electrode. Each of the collector regions 20 and the cathode regions 21 has a depth of 0.5 μm and has an impurity concentration of $7\times10^{17}$ cm$^{-3}$, for example.

Figure 2:
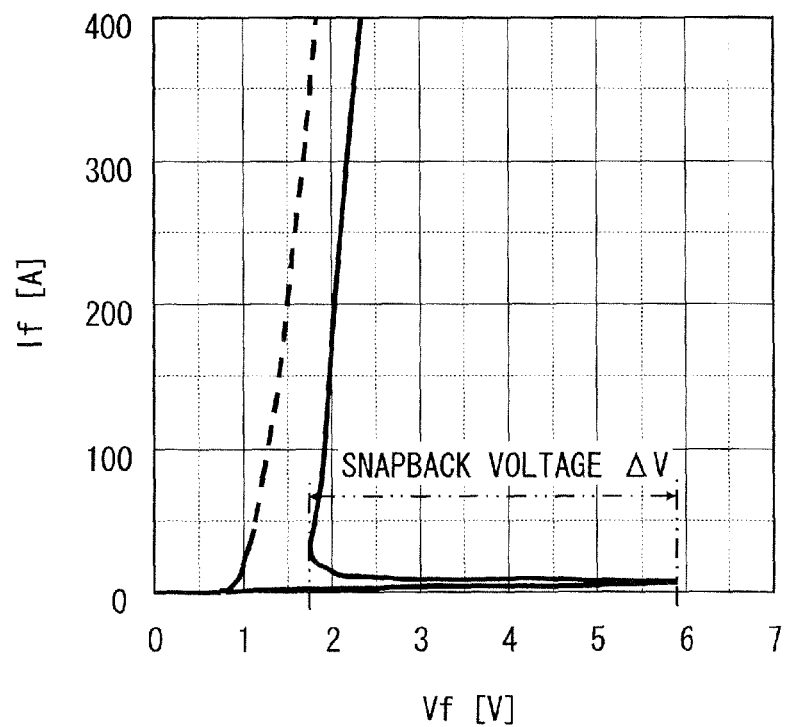
FIG. 2 is a graph showing a relationship between a forward voltage Vf and a forward electric current "If"

The inventors of the present invention performed the device simulation using the above-described semiconductor device 100. As a result of the device simulation, the inventors found that, when the gate voltage is set to be 15 V for activating the IGBT, a forward operation of the FWD may be difficult depending on a width of the FWD regions 19 in the first direction. In particular, the inventors found that a forward voltage Vf may locally increase, that is, a snapback may occur, at a small electric current region of a forward electric current "If," as illustrated by a solid line in FIG. 2. The above-described problem is specific to an RC-IGBT device that is used in an inverter circuit and that includes the IGBT and the FWD operated concurrently. When a spike-shaped snapback generates in the forward voltage Vf, the inverter circuit may malfunction. In addition, the forward voltage Vf may increase by the snapback, and a direct-current loss may increase. A dashed line in FIG. 2 shows a case where the gate voltage is 0 V.

Furthermore, the inventors confirmed by the device simulation that a primary cause of the snapback is influence of channels. When the gate voltage is set to be 15 V for activating the IGBT, a conductivity type of a portion of the base regions 11 is inverted into N type and channels are provided adjacent to the emitter regions 16. In the RC-IGBT device, in a region of the base regions 11 configured to operate as an anode of the FWD, that is, in the base regions 14 in the semiconductor device 100 in FIG. 1, a width of a portion operating as an anode is reduced due to the channel, that is, due to electric field of the gate electrodes 12. Thus, holes are difficult to be introduced from the base regions 14 in the base regions 11, and a forward operation of the FWD becomes difficult. As a result, at a small electric current region from a few A to tens of A, a snapback generates in the forward voltage Vf.

Figure 3:
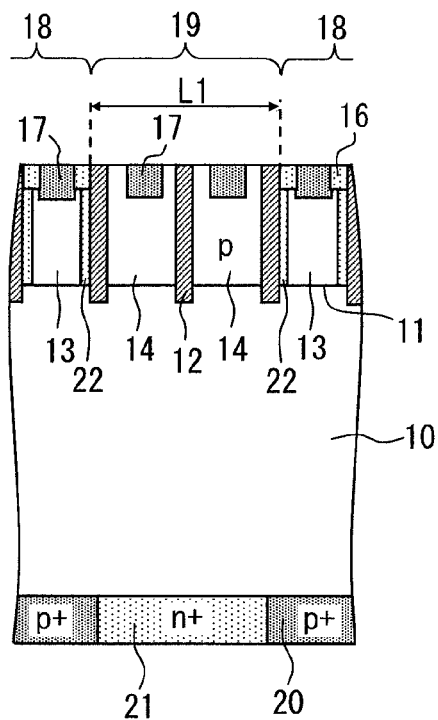
FIG. 3 is an enlarged view of the semiconductor device for explaining a channel distance L1.
Figure 4:
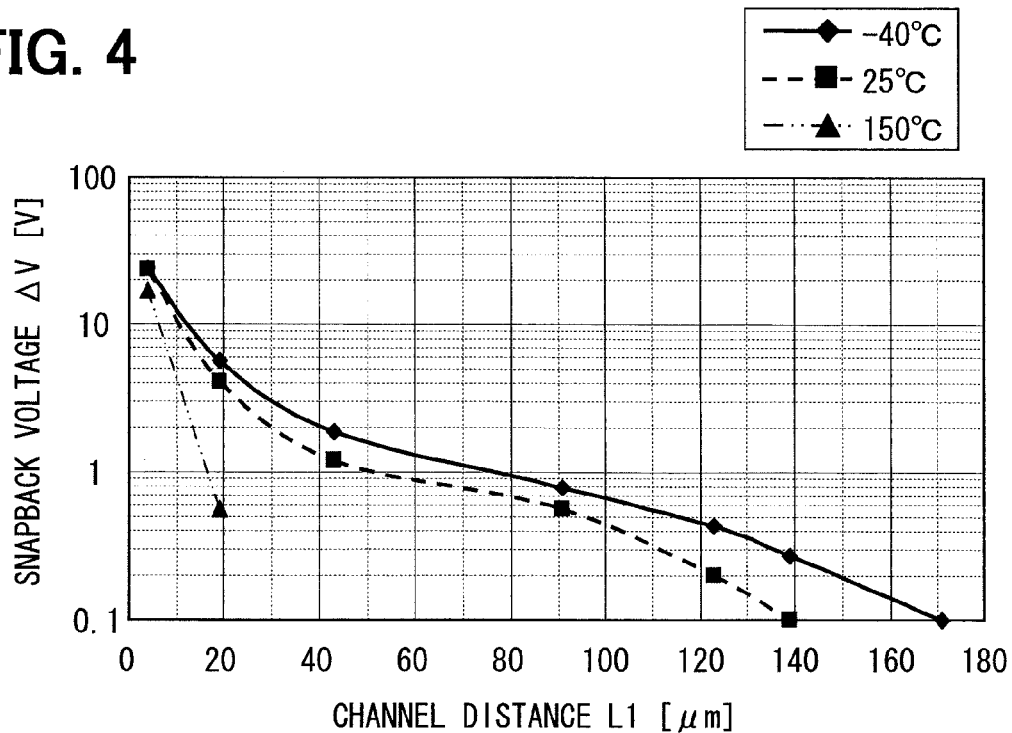
FIG. 4 is a graph illustrating a relationship between the channel distance L1 and a snapback voltage ΔV.

Then, the inventors examined a relationship between the snapback and a width of the FWD regions 19, strictly speaking, as illustrated in FIG. 3, a distance L1 between adjacent channels 22 in the first direction by a device simulation. In the composition illustrated in FIG. 3, a distance between outer edges of two of the gate electrodes 12 located on both sides of two of the base regions 14 configurating the FWD region 19 is set to be same as the distance L1. According to the device simulation, as illustrated in FIG. 4, when a temperature of the semiconductor substrate 10 is low, a snapback voltage ΔV becomes large. In addition, the inventors found that, when the distance L1 is greater than or equal to 170 μm, the snapback voltage ΔV can be restricted to be less than or equal to 0.1 V. The present invention is based on the above-descried knowledge. In FIG. 2, a simulation result of a case where the channel distance L1 is 20 μm is illustrated. In FIG. 4, a solid line, a dashed line, and a two-dotted dash line show simulation results at temperatures of −40° C., 25° C., and 150° C., respectively. When the temperature is 150° C., a snapback is not detected at measured points where the channel distance L1 is greater than or equal to 40 μm. Thus, the simulation result only at two measured points less than 40 μm are illustrated in FIG. 4.

First Embodiment

A semiconductor device 100 according to a first embodiment of the present invention will be described with reference to FIG. 5 to FIG. 7.

The semiconductor device 100 includes a semiconductor substrate 10 having first and second surfaces opposing each other. The semiconductor device 100 includes a vertical IGBT and a vertical FWD coupled in anti-parallel to each other. The IGBT has a plurality of gate electrodes 12 adjacent to the first surface of the semiconductor substrate 10. The semiconductor device 100 can be used, for example, as a power switching device for an extra-high voltage (EHV) inverter module. In the following description, the same reference numerals are given to components same as the components illustrated in FIG. 1 and FIG. 2. In addition, the thickness direction of the semiconductor substrate is expressed as the thickness direction, a direction perpendicular to the thickness direction is expressed as the perpendicular direction, and one direction in the perpendicular direction along which second regions and third regions are alternately arranged is expressed as a first direction. In the following example, the IGBT has an N type conductivity type, that is, a first conductivity type is an N type and a second conductivity type is a P type.

Figure 5:
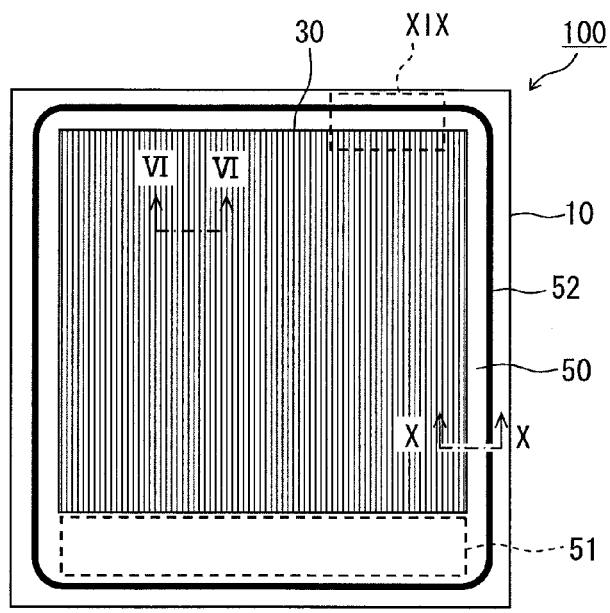
FIG. 5 is a plan view of a semiconductor device according to a first embodiment of the present invention.

As illustrated in FIG. 5, the semiconductor substrate 10 includes a main section 30 and an outer peripheral section 50. In the perpendicular direction, the outer peripheral section has a ring shape surrounding the main section 30. In the main section 30, the IGBT and at least a part of the FWD are formed. The outer peripheral section 50 includes a section 51 where some components including a gate pad (not shown) is formed and a high-voltage section 52 surrounding the main section 30 and the section 51. The high-voltage section 52 is configured to ensure a high breakdown voltage. In the semiconductor device 100 illustrated in FIG. 5, the FWD as well as IGBT is formed only in the main section 30.

Figure 6:
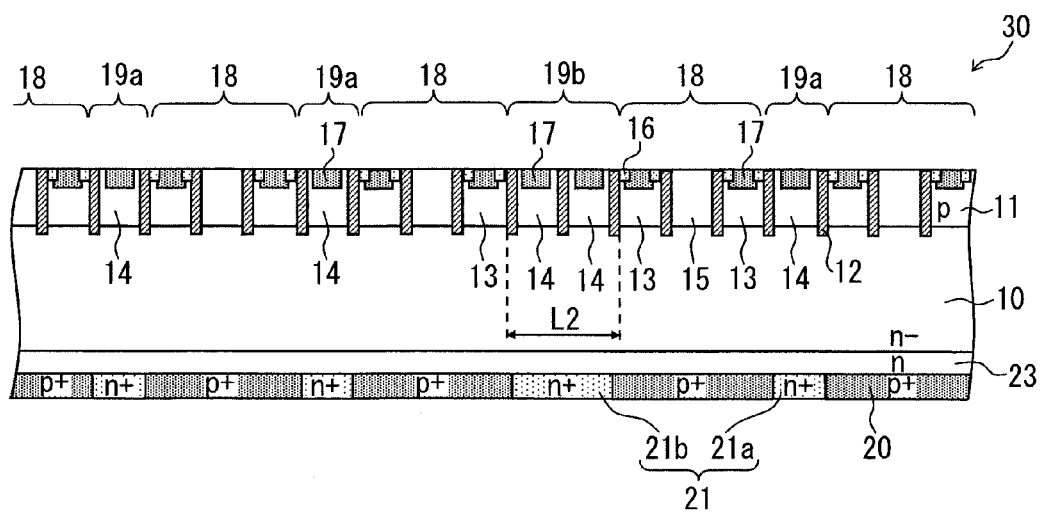
FIG. 6 is a cross-sectional view of the semiconductor device taken along line VI-VI in FIG. 5.

A composition of the semiconductor substrate 10 illustrated in FIG. 6 is basically similar to the composition of the semiconductor substrate 10 illustrated in FIG. 1 and FIG. 3. However, the semiconductor substrate 10 illustrated in FIG. 6 is different from the semiconductor substrate 10 illustrated in FIG. 1 and FIG. 3 in that FWD regions 19a and FWD regions 19b having different widths in the first direction are provided as the FWD regions 19, and a field stop layer 23 is disposed between the semiconductor substrate 10 and both collector regions 20 and cathode regions 21.

The semiconductor substrate 10 is made of a single crystal bulk silicon substrate having an N conductivity type. At a first-surface side portion of the semiconductor substrate 10, P type base regions 11 (p-well) are disposed. The gate electrodes 12 extend in a second direction perpendicular to the thickness direction and the first direction and is arranged in the first direction. The base regions 11 are separated from each other by the gate electrodes 12. The base regions 11 include base regions 13-15. The base regions 13-15 are arranged in the first direction and are electrically insulated from each other. Each of the gate electrodes 12 is coupled with a common signal line (not shown). Each of the gate electrodes 12 receives a driving signal having a predetermined voltage through the signal line. Thus, the gate electrodes 12 have the same electric potential. The gate electrodes 12 are arranged at the same intervals in the first direction, and widths of the base regions 13-15 in the first direction are fixed.

Each of the base regions 13 can operate as a fifth region. At a first-surface side of each of the base regions 13, N type emitter regions 16 and a P type base contact region 17 are disposed. Each of the N type emitter regions 16 has an impurity concentration greater than the semiconductor substrate 10. Each of the emitter regions 16 is adjacent to a sidewall of one of the gate electrodes 12, that is, an insulating layer in one of the trenches. Each of the base regions 14 can operate as a sixth region. At a first-surface side of each of the base regions 14, the base contact region 17 is disposed and the emitter regions 16 are not disposed. Each of the base regions 15 can operate as a seventh region. At a first-surface side of each of the base regions 15, a high impurity concentration region such as the emitter regions 16 and the base contact region 17 is not disposed. Each of the base regions 15 is a floating region that is not electrically coupled with the gate electrodes 12 and an emitter electrode (not shown).

The emitter regions 16 and the base contact region 17 are electrically coupled with the emitter electrode that can also operate as an anode electrode. The base regions 13 provide channels and constitute a part of the IGBT. The base regions 14 provide an anode and constitute a part of the FWD.

On a second-surface side portion of the semiconductor substrate 10, P type collector regions 20 and N type cathode regions 21 are disposed. Each of the collector regions 20 can operate as a second region that constitutes a part of the IGBT. Each of the cathode regions 21 can operate as a third region that constitutes a part of the FWD. Each of the cathode regions 21 has an impurity concentration greater than the semiconductor substrate 10. The collector regions 20 are opposed to the base regions 13 and 15, and the cathode regions 21 are opposed to the base regions 14. The collector regions 20 and the cathode regions 21 are alternately arranged in the first direction so as to be adjacent to each other at least in the main section 30.

At the first-surface side portion of the semiconductor substrate 10, each region that is located between two adjacent channels 22 (see FIG. 3), is opposed to the cathode region 21 as the third region, and includes at least a base region electrically coupled with the emitter electrode (not shown) is a unit that can operate as the FWD, that is, the above-described FWD region 19. Each of the FWD regions 19 can operate as the fourth region. In the present embodiment, each of the FW regions 19 includes the base regions 14, which includes the base contact region 17 the first-surface side portion thereof, as the base region electrically coupled with the emitter electrode and does not include the base regions 13, which includes the emitter regions 16 at the surface portion thereof. More specifically, each of the FWD regions 19 includes only the base regions 14 as the base regions 11.

In addition, at the first-surface side portion of the semiconductor substrate 10, each region that is located between two channels 22 (see FIG. 3), not includes the base regions 14, and includes the base regions 13 as a boundary with the FWD region 19 is a unit that can operate as the IGBT, that is, the above-described IGBT region 18. Each of the IGBT regions 18 can operate as a cell region of the IGBT. In the present embodiment, the base regions 13 and the base regions 15 are alternately arranged in the first direction, and the base regions 13 are located at both ends of the IGBT region 18 in the first direction.

Actually, the IGBT includes the gate electrodes 12 located on both ends of the FWD regions 19 in the first direction or both ends of the IGBT regions 18 in the first direction. However, in the present embodiment, the width of the region that is located between the channels 22, is opposed to the cathode region 21, and includes the base region such as, for example, the base region 14 in FIG. 6, electrically coupled with the emitter electrode is characteristic. Therefore, a region between the channels 22 is expressed as a unit region. The unit regions including the base regions 13 are defined as the IGBT regions 18. The unit region including the base regions 14 are defined as the FWD regions 19.

The IGBT regions 18 and the FWD regions 19 are alternately arranged in the first direction. In the present embodiment, a width of each of the IGBT regions in the first direction is uniform. Each of the IGBT regions 18 includes two base regions 13 disposed at both ends of each of the IGBT regions 18 and one base region 15 disposed between the two base regions 13.

The FWD regions 19 include only the base regions 14 as the base regions 11. The FWD regions 19 include the FWD regions 19a and the FWD regions 19b. The width of each of the FWD regions 19b in the first direction is greater than the width of each of the FWD regions 19a in the first direction. The number of the FWD regions 19a is greater than the number of the FWD regions 19b. Each of the FWD regions 19b can operate as the wide region and each of the FWD regions 19a can operate as the narrow region.

The FWD regions 19a as the narrow regions occupy most part of the FWD regions 19. In the present embodiment, each of the FWD regions 19a includes one base region 14 as the base regions 11. More specifically, in each of the FWD regions 19a, the gate electrode 12, the base region 14 and the gate electrode 12 are arranged in the first direction.

In a first-surface side area of the FWD regions 19, the FWD regions 19b account for a few % (for example, 3% to 5%). For example, each of the FWD regions 19b includes two base regions 14. More specifically, in each of the FWD regions 19b, the gate electrode 12, the base region 14, the gate electrode 12, the base region 14, and the gate electrode 12 are arranged in the first direction.

The cathode regions 21 also include cathode regions 21a and cathode regions 21b. Each of the cathode regions 21b has a width greater than a width of each of the cathode regions 21a in the first direction. Each of the cathode regions 21b is opposed to a corresponding one of the FWD regions 19b. Each of the cathode regions 21a is opposed to a corresponding one of the FWD regions 19a.

In the present embodiment, as illustrated in FIG. 6, the width of each of the FWD regions 19b as the wide regions, that is, a distance L2 between inside ends of two channels 22 located on both ends of each of the FWD regions 19b is set based on the result of the channel distance L1. The channels 22 are not illustrated in FIG. 6. Therefore, see FIG. 3. Also in the present embodiment, a distance between outside ends of two gate electrodes 12 having a trench structure and located on both ends of each of the FWD regions 19b in the first direction is same as the distance L2.

The distance L2 is greater than a distance between two channels 22 located on both ends of each of the FWD regions 19a. The distance L2 is greater than or equal to 170 μm. In the present embodiment, the widths of the base regions 13-15 are the same in the first direction. Thus, the width of each of the FWD regions 19a is about half of the width of each of the FWD regions 19b. Specifically, each of the FWD regions 19b is wider than each of the FWD regions 19a by a width of one base region 14 and one gate electrode 12.

Figure 7:
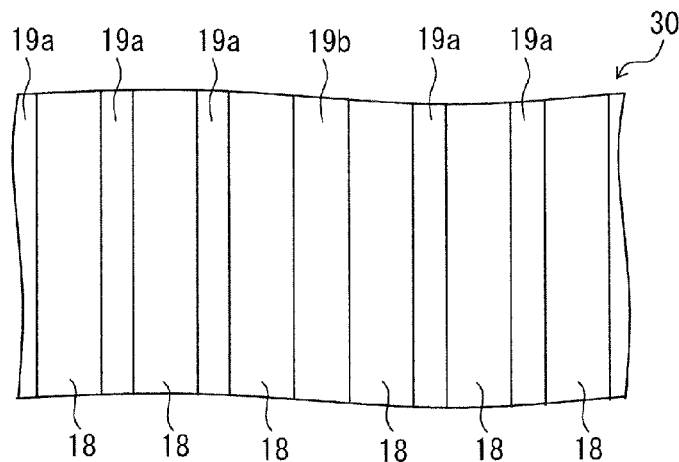
FIG. 7 is a plan view showing an arrangement of IGBT regions and FWD regions.

As illustrated in FIG. 7, the IGBT regions 18 and the FWD regions 19 including the FWD regions 19a and the FWD regions 19b are alternately arranged in the first direction. Each of the FWD regions 19b is narrower than each of the IGBT regions 18 and is wider than each of the FWD regions 19a. The number of the FWD regions 19a as the narrow regions is greater the number of the FWD regions 19b as the wide regions, and the FWD regions 19b occupy the most part of the FWD regions 19.

In the thickness direction, the N type field stop layer 23 is disposed between the semiconductor substrate 10 and both the collector regions 20 and the cathode regions 21, as illustrated in FIG. 6. The filed stop layer 23 has an impurity concentration greater than the semiconductor substrate 10 and less than the emitter regions 16. In the semiconductor device 100 that includes the IGBT including the gate electrodes 12 having the trench structure, when the field stop layer 23 for stopping a depletion layer is provided, the thickness of the semiconductor substrate 10 (semiconductor device 100) can be reduced compared with another trench structure such as, for example, a punch through type or a non punch through type. In the present case, the number of excessive carries is small and a width of a neutral region in which the depletion layer expands is narrow. Thus, a switch loss (alternating-current loss) of the IGBT can be reduced.

The semiconductor device 100 can be manufactured by a known semiconductor process. Thus, a description of a method of manufacturing the semiconductor device 100 is omitted.

An exemplary operation of the IGBT formed in the semiconductor substrate 10 will be described below. When a predetermined collector voltage is applied between the emitter electrode and the collector electrode, and a predetermined gate voltage is applied between the emitter electrode and the gate electrodes 12, that is, when a gate is turned on, N type channels are provided in the base regions 13 having the emitter regions 16 at the first-surface side. Electrons are introduced into the semiconductor substrate 10 from the emitter electrode through the channels. The introduced electrons forward-bias the collector regions 20 and the semiconductor substrate 10, and thereby holes are introduced from the collector regions 20 to the semiconductor substrate 10, a resistance of the semiconductor substrate 10 is significantly reduced, and a current carrying capacity of the IGBT is increased. In the base regions 11, only the base regions 13 having the emitter regions 16 at the first-surface side operate as a part of the IGBT, and the base regions 14 and 15 do not operate as a part of the IGBT. When the gate voltage applied between the emitter electrode and the gate electrodes 12 is set to be 0 V or a reverse bias, that is, when the gate is turned off, the channels which have been inverted into the N conductivity type return to the P conductivity type and the introduction of electrons from the emitter electrode stops. When the introduction of electrons stops, the introduction of holes from the collector regions 20 also stops. Electrons and holes stored in the semiconductor substrate 10 may be discharged from the emitter electrode and the collector electrode, respectively, or may recombine with each other and may disappear.

An exemplary operation of the FWD formed in the semiconductor substrate 10 will be described below. As described above, the emitter electrode can also operate as the anode electrode. A part of the base region electrically coupled with the emitter electrode, mainly the base regions 14 (the FWD regions 19) can operate as an anode region of the FWD. When an anode voltage (forward bias) is applied between the emitter electrode and the semiconductor substrate 10 and the anode voltage becomes greater than a threshold value, the anode region and the semiconductor substrate 10 are forward-biased and the FWD becomes conductive. Specifically, when the collector voltage is applied to the IGBT due to energy stored in the load L, the FWD provided between the anode region and the cathode regions 21 becomes conductive, and electric current flows. When a reverse bias is applied to the emitter electrode and the semiconductor substrate 10, a depletion layer expands from the anode region toward the semiconductor substrate 10. Thus, an inverse-direction high breakdown voltage can be ensured.

In the present embodiment, a part of the FWD regions 19 as the fourth regions is provided by the FWD regions 19b as the wide regions, and the most part of the FWD regions 19 are provided by the FWD regions 19a as the narrow regions. That is, in pairs of the channels located on both ends of each of FWD regions 19, a part of pairs of channels has a longer distance therebetween in the first direction than the other part of pairs of channels, and the number of pairs of the channels having a shorter distance therebetween is greater than the number of pairs of the channels having the longer distance therebetween.

A distance between the base region 14 in each of the FWD regions 19b and one of the two channels located on both ends of each of the FWD regions 19b is greater than a distance between the base region 14 in each of the FWD regions 19a and one of the two channels located on both ends of each of the FWD regions 19a. A snapback of the forward voltage Vf may generate only at the small electric current region in the forward electric current "If." Thus, the snapback of the forward voltage Vf can be restricted by setting only a part of the FWD regions 19 to the FWD regions 19b having the wide width.

In the present embodiment, the width of each of the FWD regions 19b, that is, the distance L2 between the two channels located on both ends of each of the FWD regions 19 is set to be greater than or equal to 170 µm. Thus, a snapback in the forward voltage Vf can be effectively restricted to be, for example, less than or equal to 0.1 V.

The FWD regions 19a, the number of which is greater than the number of the FWD regions 19b are set to be the narrow region. In a large electric-current region, each of the FWD regions 19a operates. Thus, in the semiconductor substrate 10, an electric current distribution during the forward operation of the FWD is uniformed, and a performance of the FWD can be improved.

Therefore, in the semiconductor device 100 according to the present embodiment, in a composition including the RC-IGBT device, the FWD can uniformly operate and a snapback of the FWD can be restricted.

In the semiconductor device 100, the base regions 11 are divided by the trench-shaped gate electrodes 12 into the base regions 13-15. Thus, a ratio of the IGBT and the FWD can be freely set by selectively disposing the base regions 13-15.

Each of the IGBT regions 18 may include only the base region 13 or each of the IGBT regions 18 may include the base region 13 and the base region 15 being in a floating state. In a case where each of the IGBT regions 18 includes the base region 15, when the IGBT is activated, carriers are not drawn through the base region 15. Thus, the carriers can be stored in the semiconductor substrate 10. Therefore, an on-voltage of the IGBT can be reduced compared with a case where each of the IGBT regions 18 includes only the base region 13.

In the semiconductor device illustrated in FIG. 6, each of the FWD regions 19b includes the two of the base regions 14 having the same width. However, the number of the base regions 14 included in each of the FWD regions 19b is not limited to the above-described example. For example, the number of the base regions 14 included in each of the FWD region 19b may be three or more.

The FWD region 19b may also include only one of the base regions 14 having a large width as the base regions 11. In an example illustrated in FIG. 8, each of the FWD regions 19a include one base region 14a, and each of the FWD region 19b include one base region 14b. The base region 14b is wider than the base region 14a in the first direction. In this case, a portion of the first-surface side of the semiconductor substrate 10 operating as a part of the FWD (anode) can have an area larger than a case where the wide region is divided by the gate electrode 12 by a width of the gate electrode 12. Thus, the forward voltage Vf of the FWD can be reduced.

In the semiconductor device illustrated in FIG. 6, each of the FWD regions 19 (19a, 19b) include only the base region 14 as the base regions 11. Each of the FWD regions 19 may include other region except for the base region 13 in addition to the base region 14. For example, each of the FWD regions 19 may also include the base region 14 and the base region 15.

Figure 9:
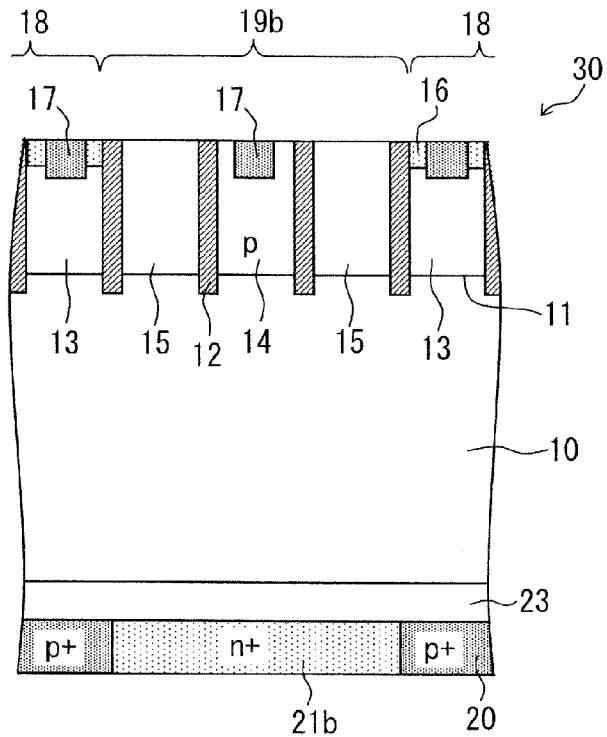
FIG. 9 is a cross-sectional view of a semiconductor device according to a second modification of the first embodiment.

In an example illustrated in FIG. 9, each of the FWD regions 19b include two base regions 15 and one base region 14 disposed between the two base regions 15. That is, in the base regions 11 included in each of the FWD regions 19b, each of the base regions 15 is located at a boundary with the IGBT region 18. Specifically, in each of the FWD regions 19b, the gate electrode 12, the base region 15, the gate electrode 12, the base region 14, the gate electrode 12, the base region 15, and the gate electrode 12 are arranged in the first direction.

Figure 8:
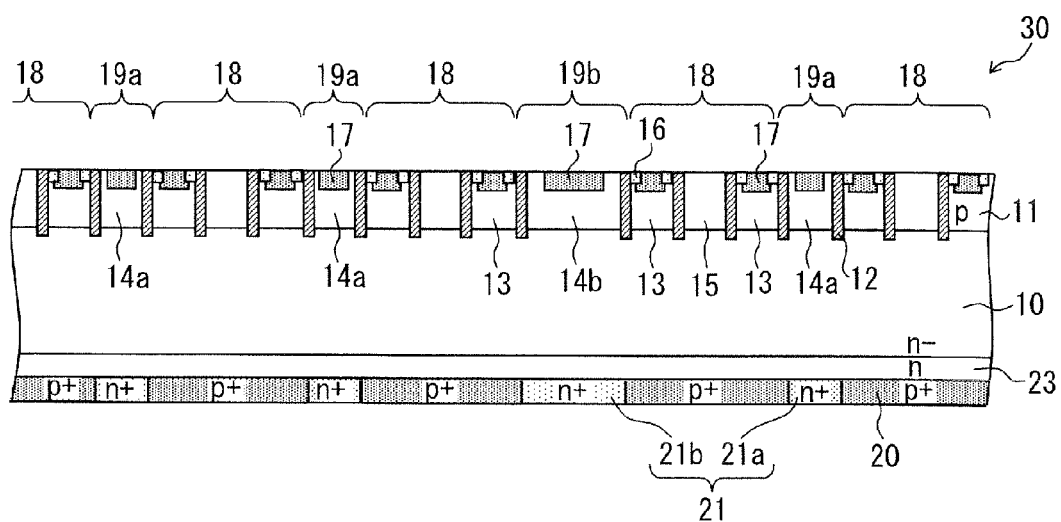
FIG. 8 is a cross-sectional view of a semiconductor device according to a first modification of the first embodiment.

As illustrated in FIG. 6 and FIG. 8, when each of the FWD regions 19b only include the base regions 14 as the base regions 11, the amount of holed introduced to the semiconductor substrate 10 during the forward operation of the FWD may increase. In the example illustrated in FIG. 9, each of the FWD regions 19 also include the base regions 15 as the base regions 11, the amount of holes introduced from each of the FWD regions 19 to the semiconductor substrate 10 can be reduced. Thus, the amount of recovery electric current Irr that flows in an inverse direction when the FWD is switched from an ON state to an OFF state can be reduced, and a switch loss and an alternating current loss can be reduced.

In addition, in the example illustrated in FIG. 9, each of the FWD regions 19b includes the base regions 15 in a floating state as boundary portions in the base regions 11 with the IGBT regions 18. Thus, a distance between the base region 14 that can operate as the anode of the FWD and the two channels located on both ends of each of the FWD regions 19b can be increased. Therefore, a snapback of the forward voltage Vf can be effectively restricted.

In the example illustrated in FIG. 9, the base regions 11 disposed adjacent to the IGBT regions 18 is the base regions 15. The base region 14 may also be disposed adjacent to the IGBT region 18. However, in a region of the base regions 11 coupled with the emitter electrode, that is, in a region having the base contact region 17 at the first-surface side, a portion close to the channels is subject to be influenced by the channels. Thus, in the example illustrated in FIG. 9, the base regions 11 adjacent to the IGBT region 18 is the base regions 15 in a floating state and the base regions 14 operating as the anode of the FWD are disposed apart from the IGBT region 18 for reducing the influence by the channels. Each of the FWD regions 19b may also not include the base region 15 for increasing the area of the anode of the FWD.

Second Embodiment

A semiconductor device 100 according to a second embodiment of the present invention will be described with reference to FIG. 10. A cross-sectional view of the semiconductor device 100 illustrated in FIG. 10 corresponds to a cross section taken along line X-X in FIG. 5.

Because the semiconductor device according to the present embodiment have many portions in common with the semiconductor device according to the first embodiment, a description of the common portions will be omitted and different portions will be mainly described. In the following description, the same reference numerals are given to components same as the components described in the first embodiment.

Figure 10:
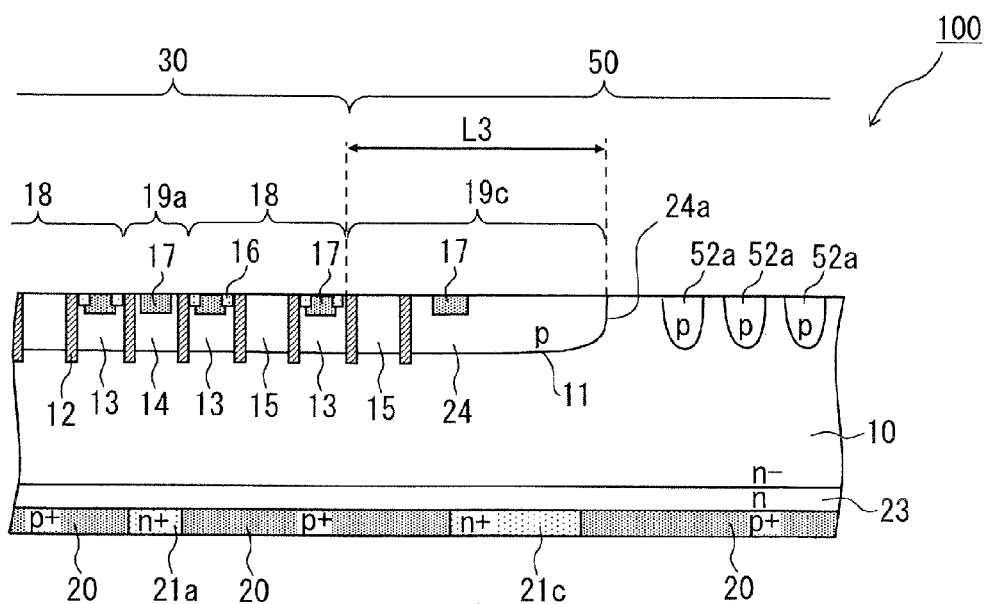
FIG. 10 is a cross-sectional view of a semiconductor device according to a second embodiment of the present invention.

In the present embodiment, a plurality of portions in the base regions 11 arranged in the first direction extends from the main section 30 of the semiconductor substrate 10 to a part of the outer peripheral section 50, as illustrated in FIG. 10. A snapback of the FWD can be restricted by using a portion of the based region 11 located at the outer peripheral section 50.

In the semiconductor device 100 illustrated in FIG. 10, a composition of the main section 30 may be similar to the composition of the main section 30 in the first embodiment. That is, at the first-surface side portion of the semiconductor substrate 10, each of the FWD regions 19 is located between two channels 22 in the first direction, is opposed to one of the cathode regions 21 as the third regions, and includes at least one of base regions of the base regions 11 (for example, base region 14) electrically coupled with the emitter electrode. In the main section 30, only the FWD regions 19a having the narrow width are disposed as the FWD regions 19. In the main section 30, the IGBT regions 18 and the FWD regions 19a are alternately arranged in the first direction at the first-surface side portion of the semiconductor substrate 10.

In the first direction, one of the IGBT regions 18 is disposed at an end portion of the main section 30, and a section located outside the one of the IGBT regions 18 is the outer peripheral section 50. A plurality of portions in the base regions 11 arranged in the first direction extends from the main section 30 into the outer peripheral section 50. The base regions 11 include an end region 24, and an outer peripheral end 24a of the end region 24 is located in the outer peripheral section 50.

The end region 24 is located between the outer peripheral end 24a and a channel 22 (not shown in FIG. 10 and see FIG. 3) closest to the outer peripheral end 24a (hereafter described as an outermost channel 22), and is electrically coupled with the emitter electrode. The end region 24 can operate as an eighth region. At the first-surface side portion of the semiconductor substrate 10, a region between the outer peripheral end 24a and the outermost channel 22 provides an FWD region 19c. The FWD region 19c can operate as a ninth region.

In the example illustrated in FIG. 10, at the portion of the base regions 11 located in the outer peripheral section 50, the base region 15 being in a floating state is disposed adjacent to the base region 13 in the IGBT region 18. The base region 15 is disposed between two gate electrodes 12. The gate electrode 12 located outside the base region 15, that is, the gate electrode 12 located on an opposite side of the base region 15 from the gate electrode 12 located between the base region 13 and the base region 15 is the outermost gate electrode 12 in the gate electrodes 12. Between the outermost gate electrode 12 and the outer peripheral end 24a of the base regions 11, the end region 24 is provided. The end region 24 includes the base contact region 17 at the first-surface side thereof and is electrically coupled with the emitter electrode (not shown).

In the outer peripheral section 50, a cathode region 21c that can function as the third region is disposed at the second-surface side portion of the semiconductor substrate 10 so as to correspond to the end region 24 as the eighth region. In the example illustrated in FIG. 10, the cathode region 21c is disposed just under the end region 24. In this way, the FWD region 19c includes the end region 24 that corresponds to the cathode regions 21c and can operate as the anode.

A width of the FWD region 19c in the first direction, that is, a distance L3 between the outer peripheral end 24a of the base regions 11 and the outermost channel 22 is greater than a half of the width of each of the FWD regions 19a as the fourth regions. Specifically, the distance L3 is greater than or equal to 85 ml.

At a portion of the outer peripheral section 50 where the base regions 11 are not provided, P type guard rings 52a are disposed at the first-surface side portion of the semiconductor substrate 10 so as to surround the main section 30 and the section 51 (see FIG. 5). The guard rings 52a are included in the high-voltage section 52.

As described above, in the semiconductor device 100 illustrate in FIG. 10, the FWD region 19c is provided between the outer peripheral end 24a of the base regions 11 and the outermost channel 22. The FWD region 19c includes the end region 24. The width of the FWD region 19c is greater than a half of the width of each of the FWD regions 19a including the base region 14 that can operate as the anode.

When the above-described composition is mirrored in the first direction around the outer peripheral end 24a of the base regions 11, the base region 13 is not disposed between the outermost channel 22 and a mirror image of the outermost channel 22. Between the outermost channel 22 and the mirror image of the outermost channel 22, the end region 24 coupled with the base contact region 17, a mirrored image of the end region 24, the base region 15 in a floating state, the gate electrodes 12, and mirror images of the base region 15 and the gate electrodes 12. The sum of the distance L3 and a distance L3 in a mirrored composition, that is, 2×L3 is same as the distance L2 described in the first embodiment. Thus, a snapback of the forward voltage Vf can be restricted.

Especially in the present embodiment, the distance L3 is set to be greater than or equal to 85 μm. As described above, the sum of the distance L3 and the distance L3 in the mirrored composition is same as the distance L2. Thus, a snapback of the forward voltage Vf can be effectively restricted, for example, to be less than or equal to 0.1 V in a manner similar to the first embodiment.

In the main section 30, the IGBT regions 18 and the FWD regions 19a are alternately arranged, and the collector regions 20 and the cathode regions 21 are alternately arranged. Thus, the IGBT the FWD can uniformly operate. Especially, in the large electric-current region, each of the FWD regions 19a accounting for most of the FWD regions 19 operates. Thus, in the semiconductor substrate 10, an electric current distribution during the forward operation of the FWD is uniformed, and a performance of the FWD can be improved.

Therefore, also in the semiconductor device 100 according to the present embodiment, in a composition including the RC-IGBT device, the FWD can uniformly operate and a snapback of the FWD can be restricted.

In the example illustrated in FIG. 10, the FWD region 19c includes the end region 24 and the base region 15 as the base regions 11. In the base regions 11 for configurating the FWD region 19c, the base region 15 is located at the boundary region with the IGBT region 18. Thus, the amount of holes introduced from the FWD region 19c to the semiconductor substrate 10 can be reduced in a manner similar to the semiconductor device 100 illustrated in FIG. 9. Therefore, the amount of recovery electric current Irr that flows in an inverse direction when the FWD is switched from an ON state to an OFF state can be reduced, and a switch loss and an alternating current loss can be reduced.

Because the FWD region 19c includes the base region 15 in a floating state as the boundary region in the base regions 11 with the IGBT region 18, the end region 24 that can operate as the anode of the FWD is apart from the channel 22. Thus, a snapback of the forward voltage Vf can be effectively restricted.

In some examples, the end region 24 may also be a boundary region in the base regions 11 with the IGBT region 18. However, in a portion of the base regions 11 coupled with the emitter electrode, that is, in a portion having the base contact region 17 at the first-surface side, a part close to the channel 22 is subject to be influenced by the channel 22. Thus, in the example illustrated in FIG. 10, the base region 15 in a floating state is disposed adjacent to the IGBT region 18 and the end region 24 that can operate as the anode is apart from the IGBT region 18 for reducing the influence by the channel 22. The FWD regions 19c may not include the base region 15 for increasing the area of the anode of the FWD.

At the first-surface side portion of the semiconductor substrate 10, as the FWD regions 19 alternately arranged with the IGBT regions 18, the FWD regions 19b and the FWD regions 19c may also be provided in addition to the FWD regions 19a having the narrow width and accounting for most of the FWD regions 19. That is, as the composition of the main section 30, the composition illustrated in FIG. 6 may be applied. Also in the case, the width of the FWD region 19c may be greater than or equal to a half of the width of each of the FWD regions 19a.

Third Embodiment

A semiconductor device 100 according to a third embodiment of the present invention will be described with reference to FIG. 11 to FIG. 13.

Because the semiconductor device 100 according to the present embodiment has many portions in common with the semiconductor device 100 according to the first embodiment or the semiconductor device 100 according to the second embodiment, a description of the common portions will be omitted and different portions will be mainly described. In the following description, the same reference numerals are given to components same as the components described in the first embodiment and the second embodiment.

Figure 11:
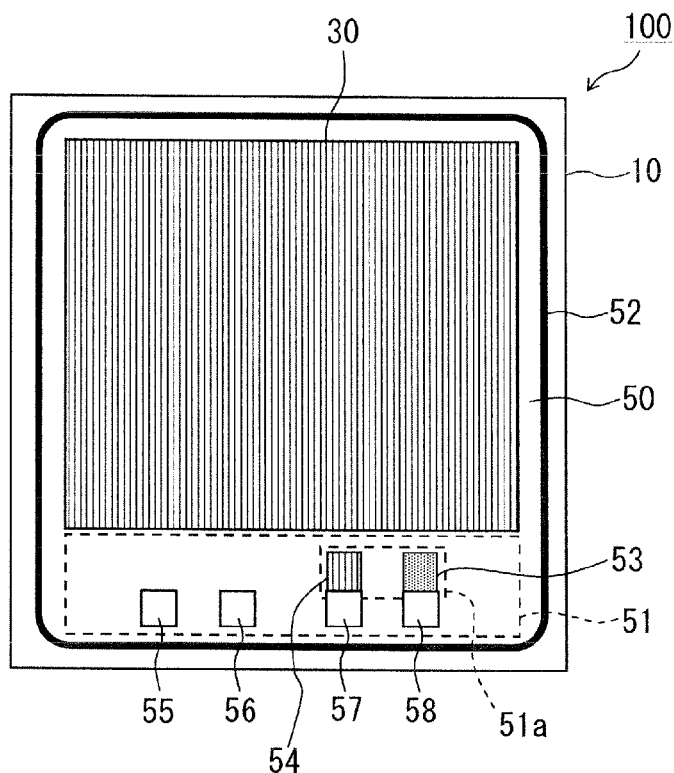
FIG. 11 is a plan view of a semiconductor device according to a third embodiment of the present invention.

In the semiconductor device 100 illustrated in FIG. 11, the section 51 in the outer peripheral section 50 includes a sense section 51a. A section where the IGBT and the FWD are disposed is expressed as an active device section. The active device section has a first area along the first surface of the semiconductor substrate 10. The sense section 51a has a second area along the first surface of the semiconductor substrate 10. The first area is greater than the second area. A composition of the semiconductor device 100 other than the section 51 may be similar to the composition of the semiconductor device 100 according to the first embodiment or the composition of the semiconductor device 100 according to the second embodiment. The semiconductor device 100 includes an IGBT 25 and an FWD 26. In the sense section 51a, a sense element is disposed. In the sense element, electric current flows in proportion to electric current flowing in the FWD 26. The semiconductor device 100 is feedback-controlled based on a detected result of the sense element so that an input of the driving signal to the gate electrode 12 of the IGBT element is stopped when the FWD 26 operates, and the driving signal is input to the gate electrode 12 when the FWD 26 does not operate.

In the semiconductor device 100 illustrated in FIG. 11, an FWD sense element 53 and an IGBT sense element 54 are separately disposed in the sense section 51a. The FWD sense element 53 has a composition similar to the FWD 26, and electric current flows in the FWD sense element 53 in proportion to the electric current flowing in the FWD 26. The IGBT sense element 54 has a composition similar to the IGBT 25, and electric current flows in the IGBT sense element is proportion to electric current flowing in the IGBT 25. For example, the FWD sense element 53 has an area of about 1/1000 of that of the FWD 26, and the IGBT sense element 54 has an area of about 1/1000 of that of the IGBT 25. The composition of the FWD sense element 53 and the IGBT sense element 54 is described in US 2009/057832 A (corresponding to JP-A-2009-099690) by one of the inventors. Thus, a detailed description of the composition of the FWD sense element 53 and the IGBT sense element 54 will be omitted.

In the section 51, the semiconductor device 100 further includes a gate pad 55 for inputting a driving signal to the gate electrode 12, an emitter sense pad 56, an IGBT sense pad 57 coupled with an emitter region of the IGBT sense element 54, and an FWD sense pad 58 coupled with an anode region of the FWD sense element 53.

Next, a feedback circuit of a gate driving signal including the semiconductor device 100 will be described. The feedback circuit is configured as a part of an inverter circuit, that is, one of an upper arm and a lower arm. The composition of the feedback circuit may be similar to that of a feedback circuit described in Japanese Patent Application No. 2007-229959 and US 2009/057832 A by one of the inventors. In a feedback circuit illustrated in FIG. 12, a sense resistor 102 is shared by the FWD sense element 53 and the IGBT sense element 54.

Figure 12:
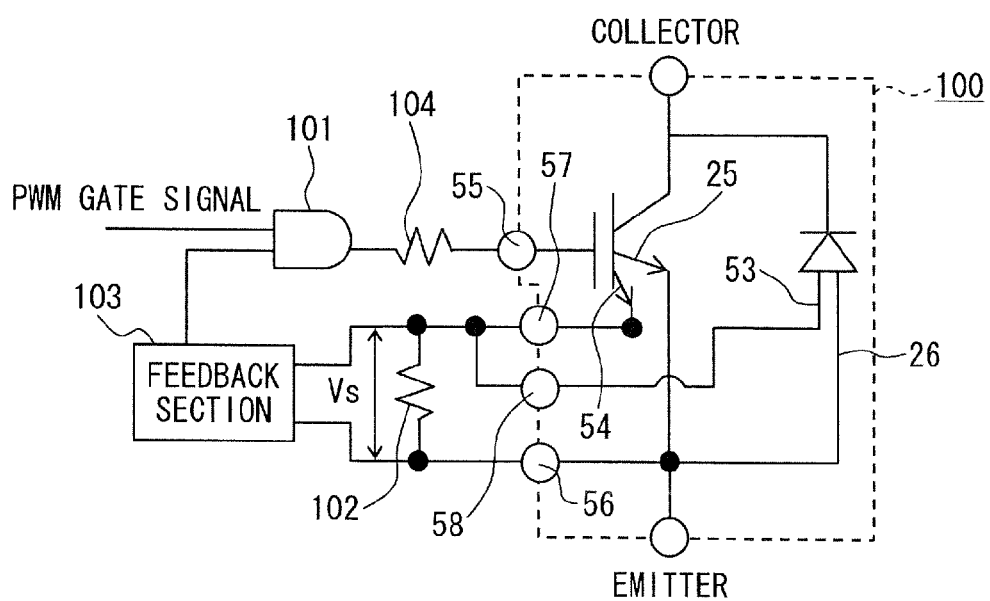
FIG. 12 is a block diagram of a feedback circuit including the semiconductor device illustrated in FIG. 11.

As illustrated in FIG. 12, the feedback circuit includes the semiconductor device 100 illustrated in FIG. 11, an AND circuit 101, the sense resistor 102, a feedback section 103, and a gate resistor 104.

The AND circuit 101 is a logic circuit that outputs a signal at a high level when all signals input to the AND circuit 101 are at a high level. The AND circuit 101 receives a PWM gate signal, which corresponds to a driving signal, for driving the IGBT 25 and the IGBT sense element 54 in the semiconductor device 100 and a signal output from the feedback section 103. For example, a PWM signal generating circuit generates the PWM gate signal, and the PWM gate signal is input to an input terminal of the AND circuit 101.

The AND circuit 101 is electrically coupled with the gate pad 55 in the semiconductor device 100 through the gate resistor 104. The gate voltage at the IGBT 25 and the IGBT sense element 54 are controlled based on the PWM gate signal supplied from the AND circuit 101 through the gate resistor 104. For example, when the PWM gate signal passing through the AND circuit 101 is at the high level, the IGBT 25 is turned on. When the PWM gate signal passing through the AND circuit 101 is at the low level, the IGBT 25 is turned off. When the PWM gate signal does not pass the AND circuit 101, the IGBT 25 and the IGBT sense element 54 are not driven.

A collector of the IGBT 25 is coupled, for example, with a load and a power source, and main electric current flows between the collector and the emitter of the IGBT 25. A collector electrode of the IGBT sense element 54 and a collector electrode of the IGBT 25 are provided by a common electrode. An emitter region of the IGBT sense element 54 is coupled with one end of the sense resistor 102 through the IGBT sense pad 57. Another end of the sense resistor 102 is coupled with the emitter region 16 of the IGBT 25 through the emitter sense pad 56. Accordingly, sense electric current flows from the emitter region of the IGBT sense element 54 into the sense resistor 102. The sense electric current is proportional to the main electric current flowing in the IGBT 25. A potential difference Vs between the two ends of the sense resistor 102 is fed back to the feedback section 103.

The feedback section 103 includes, for example, an operation amplifier. The feedback section 103 determines whether electric current flows in the FWD 26 and whether electric current flows in the IGBT 25. Then, the feedback section 103 allows or stops the passing of the PWM gate signal input into the AND circuit 101 based on determined results. The feedback section 103 has a first threshold value Vth1 and a second threshold value Vth2. The first threshold value Vth1 is used for determining whether electric current flows into the FWD 26. The second threshold value Vth2 is used for determining whether overcurrent flows into the IGBT 25. In the present example, the first threshold value Vth1 and the second threshold value Vth2 are voltage values.

When the IGBT 25 is normally driven and electric current does not flow into the FWD 26, electric current flows from the IGBT sense element 54 to the sense resistor 102. Thus, when an electric potential at the emitter region 16 of the IGBT 25 is set as a base, the potential difference Vs between the two ends of the sense resistor 102 becomes a positive value. When electric current flows into the FWD 26, electric current flows from the sense resistor 102 to the FWD sense element 53. Thus, when an electric potential at the emitter region 16 of the IGBT 25 is set as a base, the potential difference Vs between the two ends of the sense resistor 102 becomes a negative value. Therefore, the first threshold value Vth1 for detecting whether electric current flows into the FWD 26 is set to be a predetermined negative value. When overcurrent flows into the IGBT 25, the amount of sense electric current that flows from the IGBT sense element 54 to the sense resistor 102 increases. That is, the potential difference Vs between the two ends of the sense resistor 102 increases in positive region. Thus, the second threshold value Vth2 is set to be a predetermined positive value.

When the feedback section 103 drives the IGBT 25, the feedback section 103 outputs a control signal for allowing the passing of the PWM gate signal input to the AND circuit 101. In addition, the feedback section 103 receives the potential difference Vs between the two ends of the sense resistor 102. When the potential difference Vs is smaller than the first threshold value Vth1 or when the potential difference Vs is larger than the second threshold value Vth2, the feedback section 103 outputs a signal to stop the passing of the PWM gate signal input to the AND circuit 101.

In a normal operation, an external circuit such as a PWM signal generating circuit generates the PWM gate signal for driving the IGBT 25 and the IGBT sense element 54, and the PWM gate signal is input to the AND circuit 101. In this case, the FWD 26 is off and electric current does not flow into the FWD sense element 53. Thus, the electric potential at the end of the sense resistor 102 coupled with the emitter region of the IGBT sense element 54 though the IGBT sense pad 57 is higher than the end of the sense resistor 102 coupled with the emitter region 16 of the IGBT 25 through the emitter sense pad 56. The potential difference Vs between the two ends of the sense resistor 102 becomes a potential value.

Figure 13:
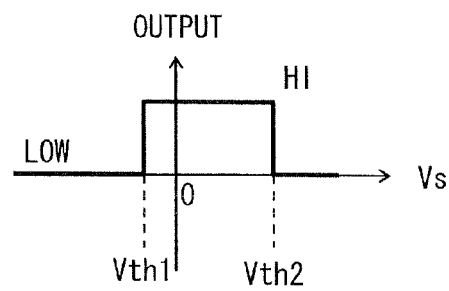
FIG. 13 is a graph showing a relationship among a potential difference Vs between two ends of a sense resistor, a diode-current detecting threshold value Vth1, an overcurrent detecting threshold value Vth2, and an output of a feedback section.

Because the potential difference Vs is larger than the first threshold value Vth1, which is set to be the predetermined negative value, as shown in FIG. 13, the feedback section 103 determines that electric current does not flow into the FWD 26. Thus, the output signal of the feedback section 103 is at a high level. When the PWM gate signal at a high level and the output signal of the feedback section 103 at a high level are input to the AND circuit 101, the PWM gate signal is allowed to pass through the AND circuit 101. The PWM gate signal is input to the gate electrodes of the IGBT 25 and the IGBT sense element 54 through the gate resistor 104, and thereby the IGBT 25 and the IGBT sense element 54 are turned on. When the IGBT 25 and the IGBT sense element 54 are driven, electric current flows to a load coupled with the collector electrode or emitter electrode of the IGBT 25.

When electric current flows into the FWD 26, the electric potential of the end of the sense resistor 102 coupled with the anode region of the FWD 26 through the emitter sense pad 56 is higher than the electric potential of the end of the sense resistor 102 coupled with the anode region of the FWD sense element 53 through the FWD sense pad 58. That is, the potential difference Vs between the two ends of the sense resistor 102 becomes a negative value.

Thus, in a case where the potential difference Vs is smaller than the first threshold value, the feedback section 103 determines that electric current flows to the FWD 26. The feedback section 103 output a signal to the AND circuit 101 so as to stop the passing of the PWM gate signal input to the AND circuit 101.

Because the signal for driving the IGBT 25 is not input from the AND circuit 101, the IGBT 25 is turned off, that is, a gate signal becomes zero. Therefore, during the forward operation of the FWD 26, the IGBT 25 does not operate.

When overcurrent flows into the IGBT 25, the amount of the sense electric current that flows from the IGBT sense element 54 to the sense resistor 102 increases in proportion to the overcurrent. The potential difference Vs between the two ends of the sense resistor Vs becomes higher than the potential difference Vs at a case where the IGBT 25 normally operates.

Thus, when the potential difference Vs is larger than the second threshold value Vth2, as shown in FIG. 13, the feedback section 103 determines that the overcurrent flows into the IGBT 25, and outputs a signal to the AND circuit 101 so as to stop the passing of the PWM gate signal input to the AND circuit 101.

Because the signal for driving the IGBT 25 is not input from the AND circuit 101, the operation of the IGBT 25 stops. Therefore, the IGBT 25 can be restricted from being damaged by the overcurrent.

The semiconductor device 100 illustrated in FIG. 11 includes the FWD sense element 53; and electric current flows in the FWD sense element 53 in proportion to electric current flowing in the FWD 26. Based on a detected result of the FWD sense element 53, when the FWD 26 operates, the driving signal is not input to the gate electrode 12 of the IGBT 25. On the other hand, when the FWD 26 does not operate, the driving signal is input to the gate electrode 12 of the IGBT 25. The IGBT 25 and the FWD 26 may have compositions similar to those described in the first embodiment or the second embodiment. Thus, a snapback of the forward voltage Vf of the FWD 26 can be restricted, and a linearity of the FWD 26 can be improved.

As described above, electric current flows in the FWD sense element 53 in proportion to electric current flowing in the FWD 26. Thus, a linearity of the FWD sense element 53 can also be improved. Therefore, the input of the PWM gate signal (driving signal) to the gate electrode 12 can be controlled at a high degree of accuracy based on the detected result of the FWD sense element 53. Each of the semiconductor devices 100 according to the above-described embodiments can be suitably used for a feedback circuit in which a feedback-control is performed using sense element including the FWD sense element 53.

In the semiconductor device illustrated in FIG. 11, the FWD sense element 53 and the IGBT sense element 54 are separately disposed in the sense section 51a in the semiconductor substrate 10. In some examples, one sense element for detecting both electric current flowing in the IGBT 25 and electric current flowing in the FWD 26 may be provided.

In the semiconductor device 100 illustrated in FIG. 11, the semiconductor device 100 includes the IGBT sense element 54 and the FWD sense element 53 as sense elements. In some examples, the semiconductor device 100 includes at least the FWD sense element 53 as a sense element.

In the feedback circuit illustrated in FIG. 11, the sense resistor 102 is shared by the IGBT sense element 54 and the FWD sense element 53. In some examples, the IGBT sense element 54 and the FWD sense element 53 may have sense resistors separately.

In the feedback circuit illustrated in FIG. 11, the sense resistor 102 is coupled with the emitter side of the IGBT sense element 54 and the anode side of the FWD sense element 53. In some examples, a sense resistor may be coupled with the collector side of the IGBT sense element 54, and a sense resistor may be coupled with the cathode side of the FWD sense element 53.

In the semiconductor device 100 illustrated in FIG. 11, the IGBT sense pad 57 coupled with the emitter region of the IGBT sense element 54 and the FWD sense pad 58 are separately provided. In some examples, the IGBT sense pad 57 and the FWD sense pad 58 may be provided by one sense pad.

Other Embodiments

Although the present invention has been fully described in connection with the exemplary embodiments thereof with reference to the accompanying drawings, it is to be noted that various changes and modifications will become apparent to those skilled in the art.

Figure 14:
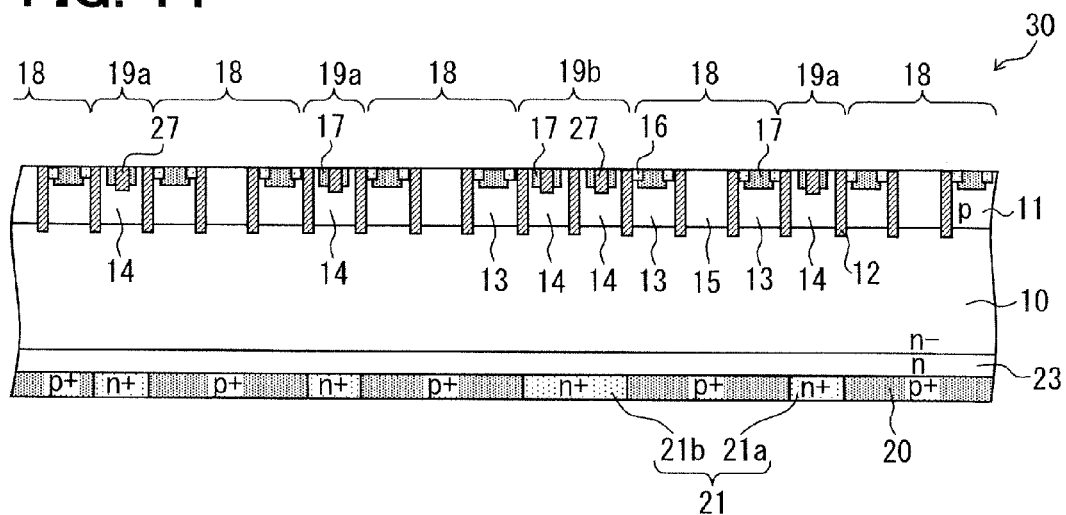
FIG. 14 is a cross-sectional view of a semiconductor device according to another embodiment of the present invention.
Figure 15:
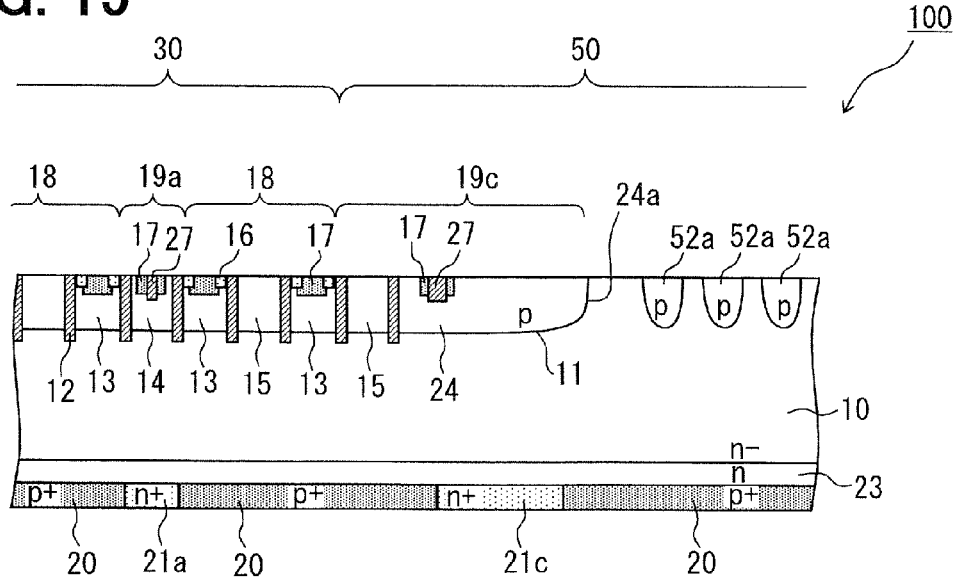
FIG. 15 is a cross-sectional view of a semiconductor device according to another embodiment of the present invention.

In the above-described embodiments, the base regions 14 and the end region 24 are electrically coupled with the emitter electrode through the base contact regions 17. In semiconductor devices illustrated in FIG. 14 and FIG. 15, a plurality of trench contact regions 27 are provided as contact regions with the emitter electrode. Each of the trench contact regions 27 is formed by providing a trench in the base regions 11 from the first surface of the semiconductor substrate 10 to a depth shallower than a bottom of the base regions 11 and filling the trench with a conductive material such as tungsten. The trench contact regions 27 penetrate the above-described P conductivity type region. The other composition of the semiconductor device illustrated in FIG. 14 and FIG. 15 may be similar to the semiconductor device 100 illustrated in FIG. 6 and the semiconductor device 100 illustrated in FIG. 10, respectively. The trench contact regions 27 can be formed by known process.

In a case where the trenches for forming the trench contact regions 27 are provided, a part of the base contact regions 17 in the base regions 14 and the end region 24, that is, a part of the base regions 11 having a high impurity concentration is removed. Thus, compared with a case where the trench contact regions 27 are not provided, the amount of holes introduced from the base contact regions 17 in the base regions 14 and the end region 24 toward the semiconductor substrate 10 is reduced. Thus, the amount of recovery electric current Irr that flows in an inverse direction when the FWD is switched from an ON state to an OFF state can be reduced, and a switch loss and an alternating current loss can be reduced. In the examples illustrated in FIG. 14 and FIG. 15, the trench contact regions 27 are provided in the base regions 14 as the wide regions and the end region 24 for restricting a snapback. In the wide regions, the amount of holes introduced to the semiconductor substrate 10 during the forward operation of the FWD increases compared with a case where the wide regions are not provided. Thus, when the trench contact regions 27 are provided in the wide regions, the amount of holes introduced to the semiconductor substrate 10 can be restricted. In the examples illustrated in FIG. 14 and FIG. 15, the trench contact regions 27 are also formed in the base regions 14 that provide the narrow regions. The trench contact regions 27 may also be formed only in the base regions 14 that provide the wide regions and the end region 24.

A short lifetime layer may be formed at a portion adjacent to a boundary of the semiconductor substrate 10 and the base regions 11, for example, by irradiating electron beam or helium line. In this case, a carrier density under the base regions 11 can be reduced. Thus, during the forward operation of the FWD, a carrier density at a portion adjacent to the regions operating as the anode region can be reduced, and thereby the amount of the recovery electric current Irr can be reduced and a switch loss can be reduced.

In each of the above-described embodiments, the semiconductor device 100 includes a field stop layer 23. In some examples, the semiconductor device 100 may be without the field stop layer 23.

In each of the above-described embodiments, the first conductivity type is the N conductivity type and the second conductivity type is the P conductivity type. Alternatively, the first conductivity type may be the P conductivity type and the second conductivity type may be the N conductivity type. That is, the semiconductor device 100 according to each of the above-described embodiments may also include a P channel IGBT.

Figure 16:
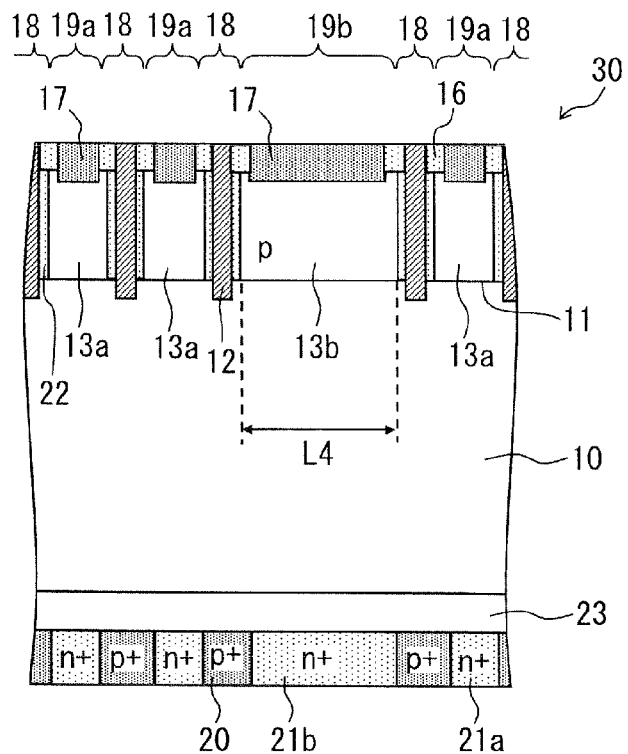
FIG. 16 is a cross-sectional view of a semiconductor device according to another embodiment of the present invention.

In the above-described embodiments, each of the base regions 14 including the base contact region 17 and without the emitter region 16 is used as the fourth region. That is, the base regions 14 provide the FWD regions 19 in the base regions 11. In an example illustrated in FIG. 16, the base regions 13 are continuously disposed along the first direction in the main section 30, and the base regions 13 can operate as an anode of the FWD. The base regions 13 include narrow base regions 13a and wide base regions 13b. Most of the base regions 13 are the narrow base regions 13a and the number of the wide base regions 13b is less than the number of the narrow base regions 13a. In each of the base regions 13, a portion between the channels 22 can operate as the FWD region 19 as the fourth region. Each of the narrow base regions 13a provides the FWD region 19a and each of the wide base regions 13b provides the FWD regions 19b. A distance L4 between inside ends of two channels 22 located on both ends of the wide base region 13b in the first direction is greater than or equal to 170 μm. Therefore, also in the example illustrated in FIG. 16, in a composition including the RC-IGBT device, the FWD can uniformly operate and a snapback of the FWD can be restricted.

In the above-described embodiments, the IGBT includes the gate electrodes 12 having a trench structure. In some examples, an IGBT may include gate electrodes 12 having a planar structure. For example, in an example illustrated in FIG. 17, P wells as base regions 11 are disposed at a first-surface side portion of a semiconductor substrate 10. Each of the base regions 11 extends along the second direction that is perpendicular to the thickness direction and the first direction. The base regions 11 are arranged in the first direction so as to be separated from each other. A surface portion of each of the base regions 11, two emitter regions 16 and a base contact region 17 are disposed. The base contact region 17 is located between the two emitter regions 16 in the first direction. On the first-surface side portion of the semiconductor substrate 10, gate electrodes 12 having a planar structure are disposed through an insulating layer (not shown). Each of the gate electrodes 12 bridges two emitter regions 16 in the adjacent base regions 11. The base regions 11 include base regions 11a and base regions 11b. A width of each of the base regions 11b is greater than a width of each of the base regions 11a. Each of the base regions 11b can operate as a wide region and each of the base regions 11a can operate as a narrow region. Most of the base regions 11 are the base regions 11a and the number of the base regions 11b is less than the number of the base regions 11a.

In the base regions 11a and 11b, portions between the channels 22 can operate as fourth regions. Each of the base regions 11b having the wide width provides the FWD region 19b, and each of the base regions 11a having the narrow width provides the FWD region 19a. In each of the base regions 11b, the channels 22 are provided adjacent to the emitter regions 16, and a distance L5 between inside ends of the channels 22 is greater than or equal to 170 μm. Also in the example illustrated in FIG. 17, in a composition including the RC-IGBT device, the FWD can uniformly operate and a snapback of the FWD can be restricted.

Figure 17:
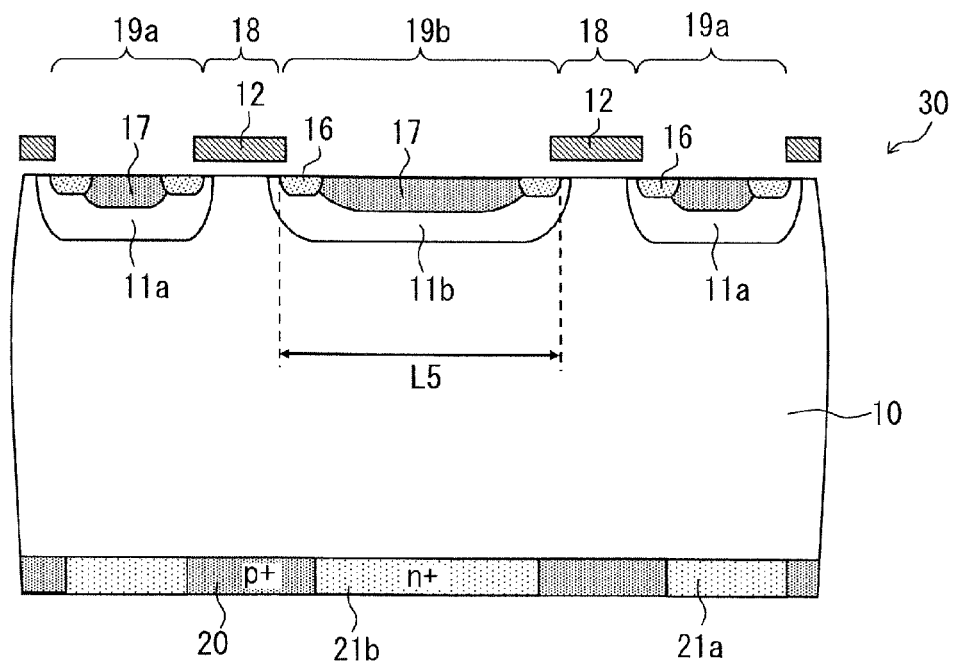
FIG. 17 is a cross-sectional view of a semiconductor device according to another embodiment of the present invention.

In the example illustrated in FIG. 17, a part of the base regions 11 including the emitter regions 16 can operate as an anode. That is, in the composition illustrated in FIG. 16, the structure of the gate electrodes 12 is changed into the planar structure. In an example illustrated in FIG. 18, a semiconductor device includes specific regions operating as an anode. That is, in the composition illustrated in FIG. 6, the structure of the gate electrodes 12 is changed into the planar structure. Also in the example illustrated in FIG. 18, p wells as base regions 11 are disposed at a first-surface side portion of a semiconductor substrate 10. Each of the base regions 11 extends along the second direction that is perpendicular to the thickness direction and the first direction. The base regions 11 are arranged in the first direction so as to be separated from each other. The base regions 11 include base regions 11a, 11c, and 11d. Each of the base regions 11a includes two emitter regions 16 and a base contact region 17 at a first-surface side portion thereof. The base contact region 17 is located between the two emitter regions 16. In each of the base regions 11c and 11d, only the base contact region 17 is disposed. The base regions 11a provide IGBT regions 18, and the base regions 11c and 11d provide FWD regions 19. The IGBT regions 18 and the FWD regions 19 are alternately arranged in the first direction. The gate electrodes 12 are formed so as to bridge the adjacent base regions 11. A width of each of the base regions 11c is less than a width of the base regions 11d. Most of base regions 11b and 11c including only the base contact regions 17 are the base regions 11c, and the number of the base regions 11d is less than the number of base regions 11c. Each of the base regions 11c can operate as a narrow region and each of the base regions 11d can operate as a wide region. A width L6 between channels located on both sides of each of the base regions 11d is greater than or equal to 170 μm. Also in the example illustrated in FIG. 18, in a composition including the RC-IGBT device, the FWD can uniformly operate and a snapback of the FWD can be restricted. In the examples illustrated in FIG. 17 and FIG. 18, each of the semiconductor devices does not include a field stop layer 23. Each of the semiconductor devices may also include a field stop layer 23.

Figure 18:
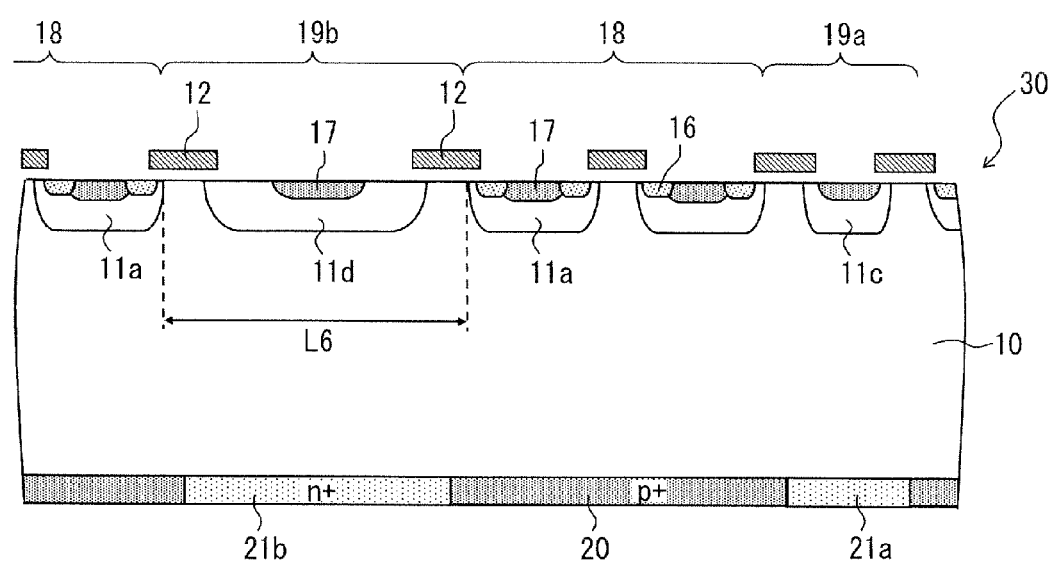
FIG. 18 is a cross-sectional view of a semiconductor device according to another embodiment of the present invention.

In the semiconductor device 100 illustrated in FIG. 18, the width of each of the base regions 11d included the FWD regions 19b as the wide regions is set to be greater than the width of each of the base regions 11c included in the FWD regions 19a as the narrow regions and the width of each of the base regions 11a included in the IGBT regions 18. The region of the base regions 11 that can operate as the anode is required to be apart from the channel 22 closest to the region. Thus, even when the width of each of the base regions 11d is same as the width of each of the base regions 11a or the width of each of the base regions 11c, the FWD regions 19 can be wide regions by controlling distances between the base regions 11a and the base regions 11d.

In the semiconductor device 100 illustrated in FIG. 10, a plurality of base r base regions 11 are arranged along the first direction into the outer peripheral section 50. The end region 24 that can operate as the eighth region is provided between the outer peripheral end 24a of the base regions 11 and the outermost channel 22. At the second-surface side portion of the semiconductor substrate 10, the cathode region 21c is disposed so as to be opposed to the end region 24. The FWD region 19c includes the end region 24 and is provided between the outer peripheral end 24a of the base regions 11 and the outermost channel 22. The FWD region 19c can operate as the ninth region. The width of the FWD region 19c in the first direction is set to be greater than or equal to a half of the width of each of the FWD region 19a in the first direction in the main section 30. However, a composition of an FWD formed in the outer peripheral section 50 for restricting a snapback is not limited to the above-described example.

A semiconductor device 100 according to another embodiment of the present invention will be described with reference to FIG. 19 to FIG. 21. A region of the semiconductor device 100 illustrated in FIG. 19 corresponds to a region XIX in the semiconductor device 100 illustrated in FIG. 5. In the semiconductor device 100 illustrated in FIG. 19 to 21, the gate electrodes 12 each having a rectangular loop shape are arranged in the first direction and the base regions 11 (p well) are divided by the gate electrodes 12 in the first direction.

In the base regions 11 being opposed to the collector regions 20 (not shown), portions surrounded by the gate electrodes 12 are the base regions 15 in a floating state, and portions between adjacent gate electrodes 12 are the base regions 13 each including the emitter regions 16 and the base contact region 17. In the IGBT regions 18, the base regions 13 and the base regions 15 are alternately arranged in the first direction and the base regions 13 are disposed at both ends of each of the IGBT regions 18 in the first direction.

All the base regions 11 (the base regions 11 surrounded by the gate electrodes 12 and the base regions 11 located between adjacent gate electrodes 12) being opposed to the cathode regions 21a are the base regions 14 each including the base contact region 17 at the first-surface side portion thereof. At the first-surface side portion of the semiconductor substrate 10, the regions between adjacent channels (not shown) and including the base regions 14 are the FWD regions 19a.

At the first-surface side portion of the semiconductor substrate 10, the base regions 11 extends into the outer peripheral section 50, and the end region 24 of the P type conductivity type is provided. The end region 24 is electrically coupled and is integrated with the base regions 11 located between the adjacent channels 12, that is, the base regions 13 and a part of the base regions 14. Each of the base contact regions 17 extends in the second direction perpendicular to first direction into the outer peripheral section 50. The base contact regions 17 disposed at the first-surface side portion of the base regions 11 located between the adjacent gate electrodes 12 are also operate as the base contact regions 17 of the end region 24. In the example illustrated in FIG. 19 to FIG. 21, the FWD region 19c as the ninth region includes only the end region 24 as the eighth region.

The width of the FWD region 19c in the first direction, that is, the distance L3 between the outer peripheral end 24a of the base regions 11 and a channel closest to the outer peripheral end 24a is greater than an half of a width L7 of each of the FWD regions 19a in the first direction. In addition, the distance L3 is greater than or equal to 85 μm.

Also in the present composition, the end region 24 electrically coupled with the emitter electrode and located in the outer peripheral section 50 can operate as an FWD with the cathode region 21c being opposed to the end region 24, in a manner similar to the end region 24 and the cathode region 21c illustrated in FIG. 10. Thus, a snapback of the FWD can be reduced. Each of the FWD regions 19a can operate as the narrow region. By providing the FWD regions 19a, a current distribution in the semiconductor substrate 10 during the forward operation of the FWD can be uniformed and a performance of the FWD ca be improved. That is, in a composition including the IGBT and the FWD in the semiconductor substrate 10, the FWD can uniformly operate and a snapback of the FWD can be restricted.

Figure 19:
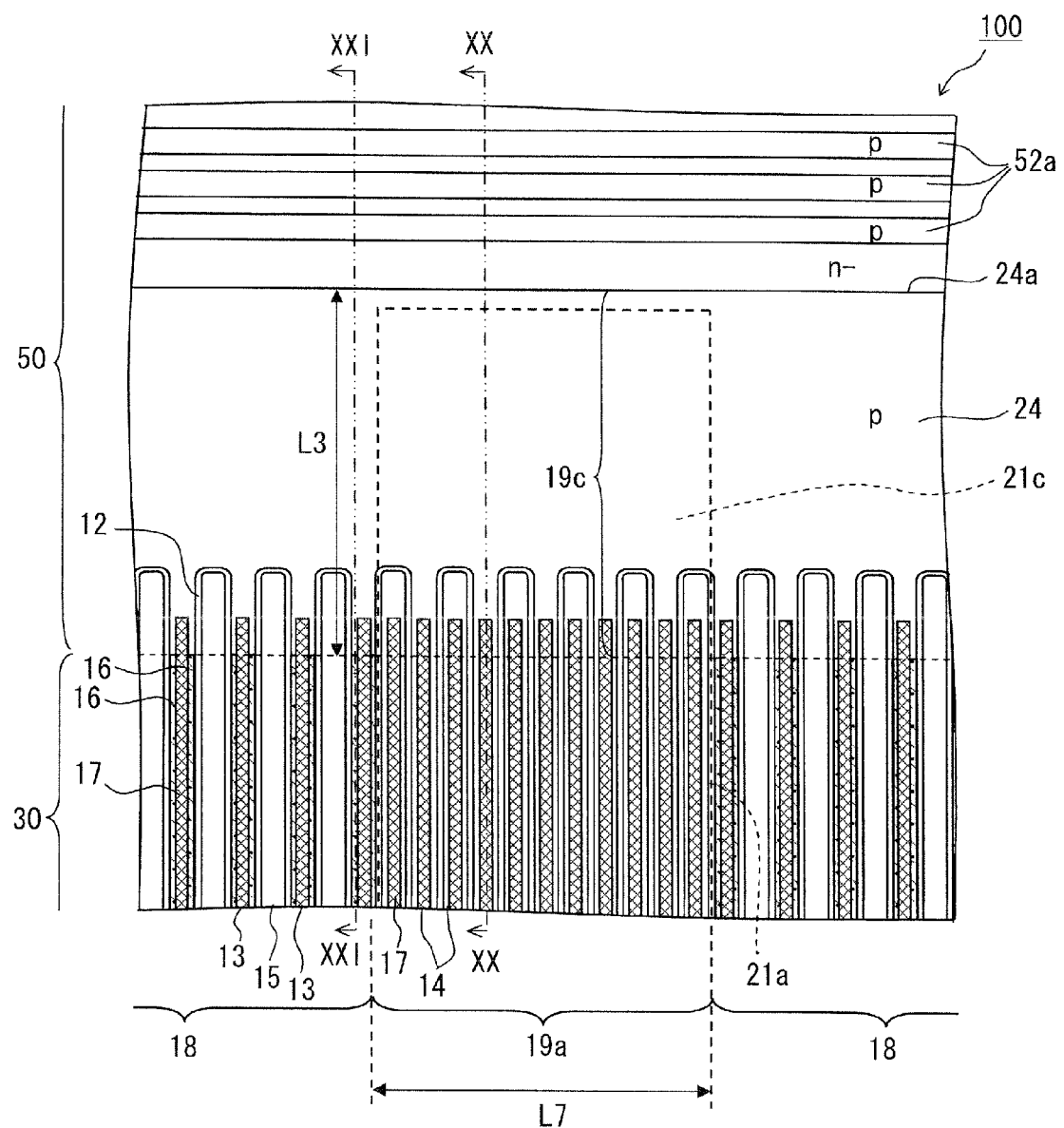
FIG. 19 is a plan view of a semiconductor device according to another embodiment of the present invention.
Figure 20:
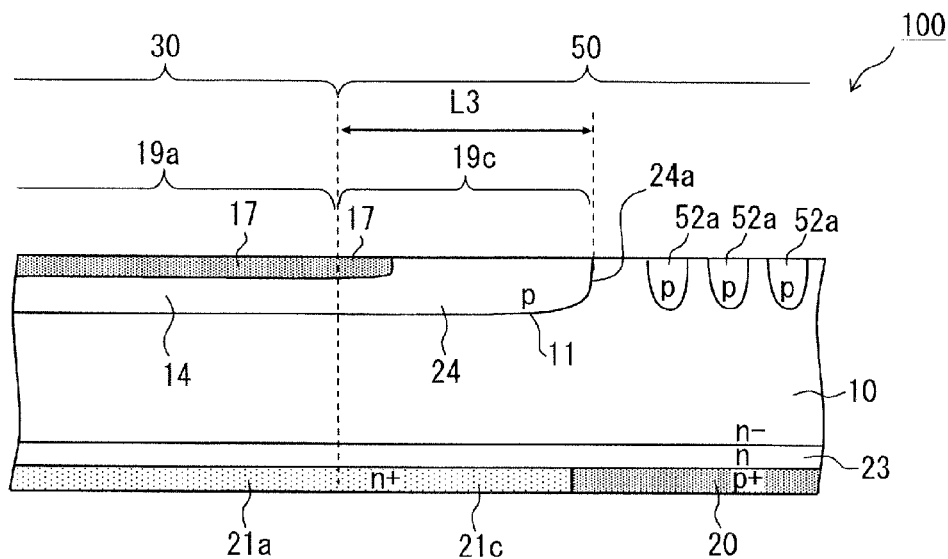
FIG. 20 is a cross-sectional view of the semiconductor device taken along line XX-XX in FIG. 19.
Figure 21:
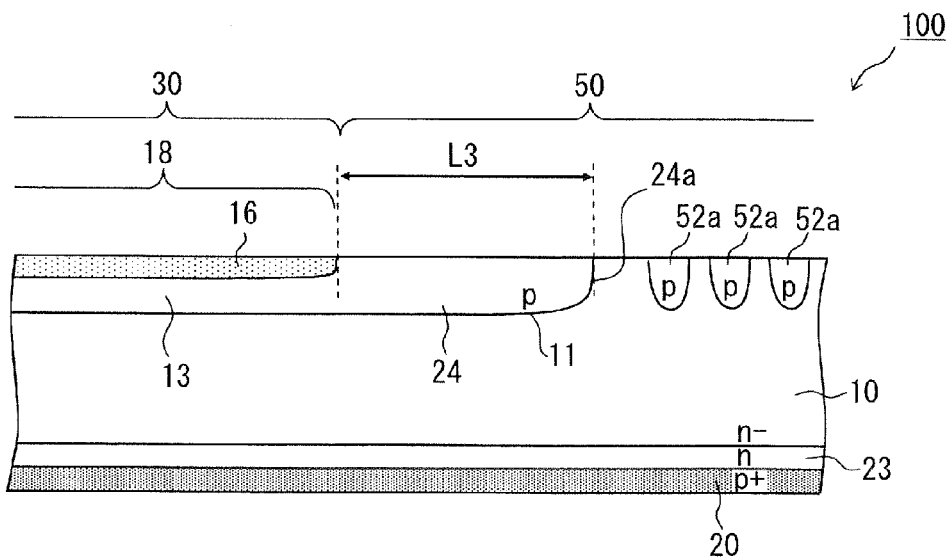
FIG. 21 is a cross-sectional view of the semiconductor device taken along line XXI-XXI in FIG. 19.

In the semiconductor device 100 illustrated in FIG. 19 to FIG. 21, the FWD regions 19a include only the base regions 14 as the base regions 11. However, compositions of the IGBT regions 18 and the FWD regions 19a are not limited to the above-described example. For example, the FWD regions 19a may include the base regions 14 and the base regions 15. The numbers of base regions 11 configurating each of the IGBT regions 18 and the FWD regions 19a are not limited to the above-described example. The base contact region 17 for the end region 24 may also provided separately from the base contact regions 17 disposed in the main section 30.

In each of the semiconductor devices 100 according to the above-described embodiments, the gate electrodes 12 are arranged in the first direction at predetermined intervals in a stripe pattern so as to divide the base regions 11. An arrangement of the gate electrodes 12 is not limited to the above-described examples. The gate electrodes 12 may have any shape as longs as the gate electrodes 12 are arranged in the first direction at predetermined intervals. For example, a planar shape of each of the gate electrodes 12 may be a polygonal shape such as square and hexagon or a circular shape.

In each of the above-described embodiments, boundaries of the collector regions 20 and the cathode regions 21a and 21b are located just under the gate electrodes 12 located at the ends of the FWD regions 19a and 19b. However, the positions of the boundaries of the collector regions 20 and the cathode regions 21a and 21b are not limited to the above-described examples. In the main section 30 of the first-surface side of the semiconductor substrate 10, the FWD regions 19a and 19b as the fourth regions are regions located between the adjacent channels 22, being opposed to the cathode regions 21a and 21b, and including at least the base region 14 electrically coupled with the emitter electrode. Thus, the cathode regions 21a and 21b may also be located just under the base regions 11 located at the ends of the IGBT regions 18. In a case where five base regions 11 are disposed between the adjacent channels 22, the collector regions 20 may be located under the base regions 11 located at both ends, and the cathode regions 21a and 21b may be located under the base regions 11 (base regions 14) disposed between the base regions 11 at both ends.

What is claimed is:

1. A semiconductor device including a vertical insulated gate bipolar transistor (IGBT) and a vertical free-wheeling diode in a semiconductor substrate of a first conductivity type, the semiconductor substrate having a first surface and a second surface opposing each other, the vertical IGBT and the vertical free-wheeling diode coupled in anti-parallel with each other, the vertical IGBT including a gate electrode adjacent to the first surface of the semiconductor substrate, the semiconductor substrate including a first-surface side portion adjacent to the first surface and a second-surface side portion adjacent to the second surface, the semiconductor substrate having a main section where the vertical IGBT is disposed and an outer peripheral section having a ring shape and surrounding the main section in one direction perpendicular to a thickness direction of the semiconductor substrate, the semiconductor device comprising:

a plurality of base regions of a second conductivity type disposed at the first-surface side portion of the semiconductor substrate, the plurality of base regions arranged along the one direction, the plurality of base regions located across the main section and an outer peripheral end of the plurality of base regions located at the outer peripheral section, each of the plurality of base regions including a first-surface side portion adjacent to the first surface of the semiconductor substrate;

a plurality of first regions of the first conductivity type disposed at the first-surface side portion of a part of the plurality of base regions, the plurality of first regions having an impurity concentration higher than an impurity concentration of the semiconductor substrate, the plurality of first regions constituting a part of the vertical IGBT;

an electrode electrically coupled with a part of the plurality of base regions and the plurality of first regions; and a plurality of second regions of the second conductivity type and a plurality of third regions of the first conductivity type disposed at the second-surface side portion of the semiconductor substrate, ones of the plurality of second regions and ones of the plurality of third regions alternately arranged in the one direction so as to be adjacent to each other, the plurality of second regions constituting a part of the vertical IGBT, the plurality of third regions constituting a part of the vertical free-wheeling diode, the plurality of third regions having an impurity concentration higher than the impurity concentration of the semiconductor substrate, wherein:

when the vertical IGBT is in an operating state, a plurality of channels of the first conductivity type is provided in the part of the plurality of base regions including the plurality of first regions in such a manner that ones of the plurality of channels is respectively adjacent to ones of the plurality of first regions;

the plurality of base regions includes an eighth region at the outer peripheral section;

the eighth region is a region from the outer peripheral end of the plurality of base regions to a predetermined distance from the outer peripheral end and is located within a region between the outer peripheral end and one of the plurality of channels closest to the outer peripheral end in the one direction or a direction perpendicular to the one direction and the thickness direction of the semiconductor substrate;

one of the plurality of third regions is located at the outer peripheral section and is opposed to the eighth region;

the first-surface side portion of the semiconductor substrate further includes a plurality of fourth regions and a ninth region;

ones of the plurality of fourth regions are respectively opposed to ones of the plurality of third regions;

each of the plurality of fourth regions is located between adjacent two of the plurality of channels and includes one region of the plurality of base regions electrically coupled with the electrode;

the ninth region is the region between the outer peripheral end of the plurality of base region and the one of the plurality of channels closest to the outer peripheral end;

each of the plurality of fourth regions has a first width in the one direction;

the ninth region has a second width between the outer peripheral end and the one of the plurality of channels closest to the outer peripheral end; and the second width is greater than a half of the first width.

2. The semiconductor device according to claim 1, wherein:

the outer peripheral end is located at the outer peripheral section in the one direction;

the eighth region is located within the region between the outer peripheral end and the one of the plurality of channels closest to the outer peripheral end in the one direction;

the ninth region is the region between the outer peripheral end of the plurality of base region and the one of the plurality of channels closest to the outer peripheral end in the one direction; and the second width is a width of the ninth region in the one direction.

3. The semiconductor device according to claim 2, wherein:

the plurality of base regions further includes a seventh region without the plurality of first regions, electrically separated from the electrode, and being in a floating state;

the ninth region includes the seventh region as a boundary region with the main section; and the seventh region is located between the main section and the eighth region in the one direction.

4. The semiconductor device according to claim 1, wherein the second with is greater than or equal to 85 μm.

5. The semiconductor device according to claim 1, wherein:

the gate electrodes includes a plurality of gate electrode regions;

the plurality of gate electrode regions is disposed at the first-surface side portion of the semiconductor substrate and is arranged in the first direction so that the plurality of base regions is separated from each other by the plurality of gate electrode regions;

each of the plurality of gate electrode regions is made by providing a trench from the first surface of the semiconductor substrate, disposing an insulating layer on a surface of the trench, and filling the trench with a conductive member through the insulating layer; and ones of the first regions is respectively adjacent to a side surface of ones of the plurality of gate electrode regions.

6. The semiconductor device according to claim 1, wherein:

the eighth region includes a trench contact region as a contact region with the electrode; and the trench contact region is made by providing a trench from the first surface of the semiconductor substrate and filling the trench with a conductive member.

7. The semiconductor device according to claim 1, further comprising a feedback section, wherein:

the semiconductor substrate further includes an active device section and a sense section;

the active device section includes the vertical IGBT and the vertical free-wheeling diode;

the sense section includes a sense element configured to detect an electric current proportional to an electric current flowing in the vertical free-wheeling diode;

the active device section has a first area along the first surface of the semiconductor substrate;

the sense section has a second area along the first surface of the semiconductor substrate;

the first area is greater than the second area;

the feedback section determines whether the vertical free-wheeling diode is in an operating state or a non-operating state based on a detected result of the sense element;

the feedback section stops an input of a driving signal to the gate electrode when the feedback section determines that the vertical free-wheeling diode is in the operating state; and the feedback section allows the input of the driving signal to the gate electrode when the feedback section determines that the vertical free-wheeling diode is in the non-operating state.

* * * * *